(12) United States Patent
Choi et al.

(10) Patent No.: US 11,114,445 B2
(45) Date of Patent: Sep. 7, 2021

(54) SEMICONDUCTOR DEVICE

(71) Applicant: Samsung Electronics Co., Ltd., Suwon-si (KR)

(72) Inventors: Jay-Bok Choi, Yongin-si (KR); Hyeonok Jung, Daejeon (KR); Jemin Park, Suwon-si (KR); Yongseok Ahn, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/909,200

(22) Filed: Jun. 23, 2020

(65) Prior Publication Data
US 2021/0111178 A1 Apr. 15, 2021

(30) Foreign Application Priority Data
Oct. 15, 2019 (KR) ........................ 10-2019-0127954

(51) Int. Cl.
| | | |
|---|---|---|
| *H01L 27/108* | (2006.01) | |
| *H01L 27/11529* | (2017.01) | |
| *H01L 27/11548* | (2017.01) | |
| *G11C 7/06* | (2006.01) | |

(52) U.S. Cl.
CPC ......... *H01L 27/10897* (2013.01); *G11C 7/06* (2013.01); *H01L 27/11529* (2013.01); *H01L 27/11548* (2013.01)

(58) Field of Classification Search
CPC ......... H01L 27/10897; H01L 27/11529; H01L 27/11548; H01L 21/7621; H01L 21/027; H01L 21/76816; H01L 21/76895; H01L 21/31105; H01L 27/12
See application file for complete search history.

(56) References Cited

U.S. PATENT DOCUMENTS

| | | | |
|---|---|---|---|
| 9,634,012 B2 | 4/2017 | Park et al. | |
| 9,761,452 B1 | 9/2017 | Shu et al. | |
| 9,929,013 B2 | 3/2018 | Kim et al. | |
| 2014/0029734 A1 | 1/2014 | Kim et al. | |
| 2017/0345710 A1 | 11/2017 | Park et al. | |

FOREIGN PATENT DOCUMENTS

| | | |
|---|---|---|
| JP | 2016111206 A | 6/2016 |
| KR | 10-2010-0006012 A | 1/2010 |
| KR | 10-2015-0094073 A | 8/2015 |
| KR | 10-1909141 B1 | 10/2018 |

*Primary Examiner* — David Vu
(74) *Attorney, Agent, or Firm* — Myers Bigel, P.A.

(57) ABSTRACT

A semiconductor device includes a substrate having an active pattern, a cell region on the substrate and having a cell circuit, and a core region on the substrate having a peripheral circuit. In plan view, the active pattern on the core region includes a plurality of corners. Each of the corners has a rounding index that is equal to or less than about 15 nm. The rounding index is a distance between a respective tip of each of the corners and a right-angled corner.

20 Claims, 34 Drawing Sheets

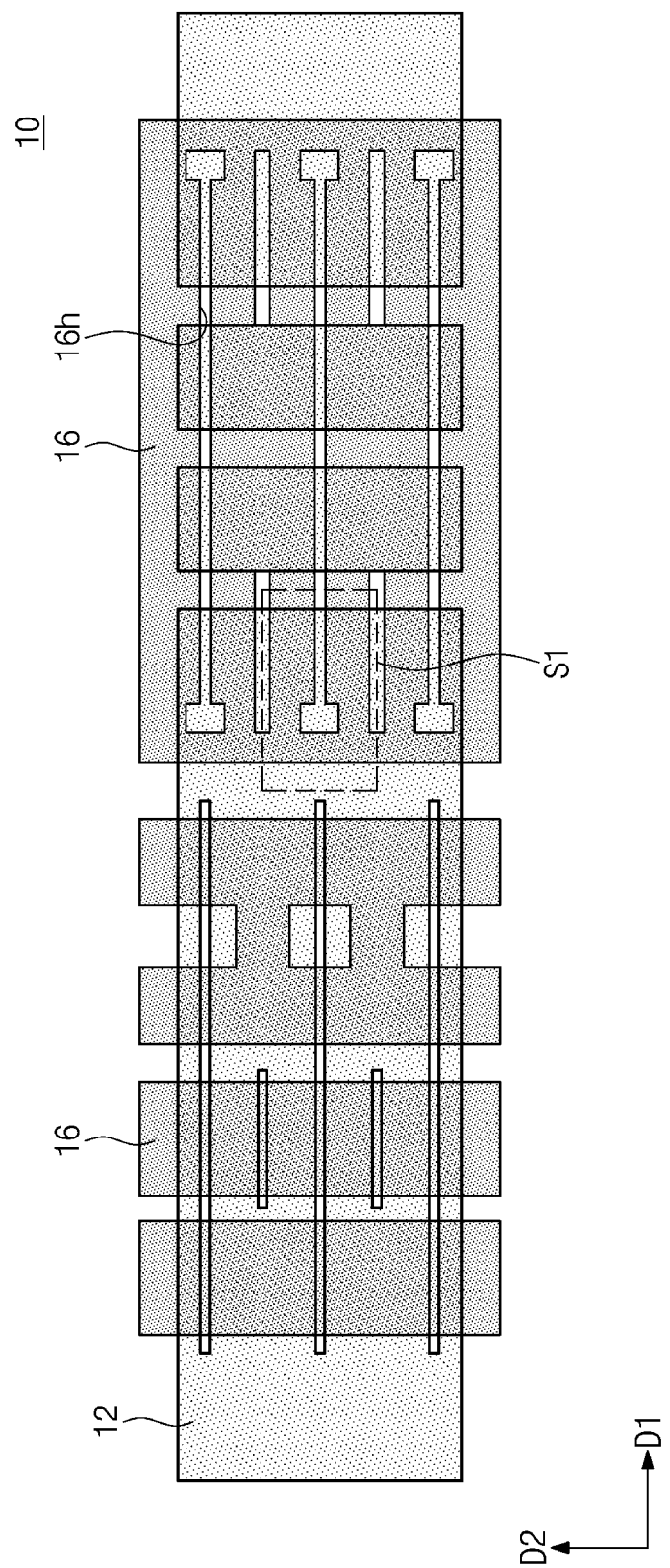

(Comparative Example)

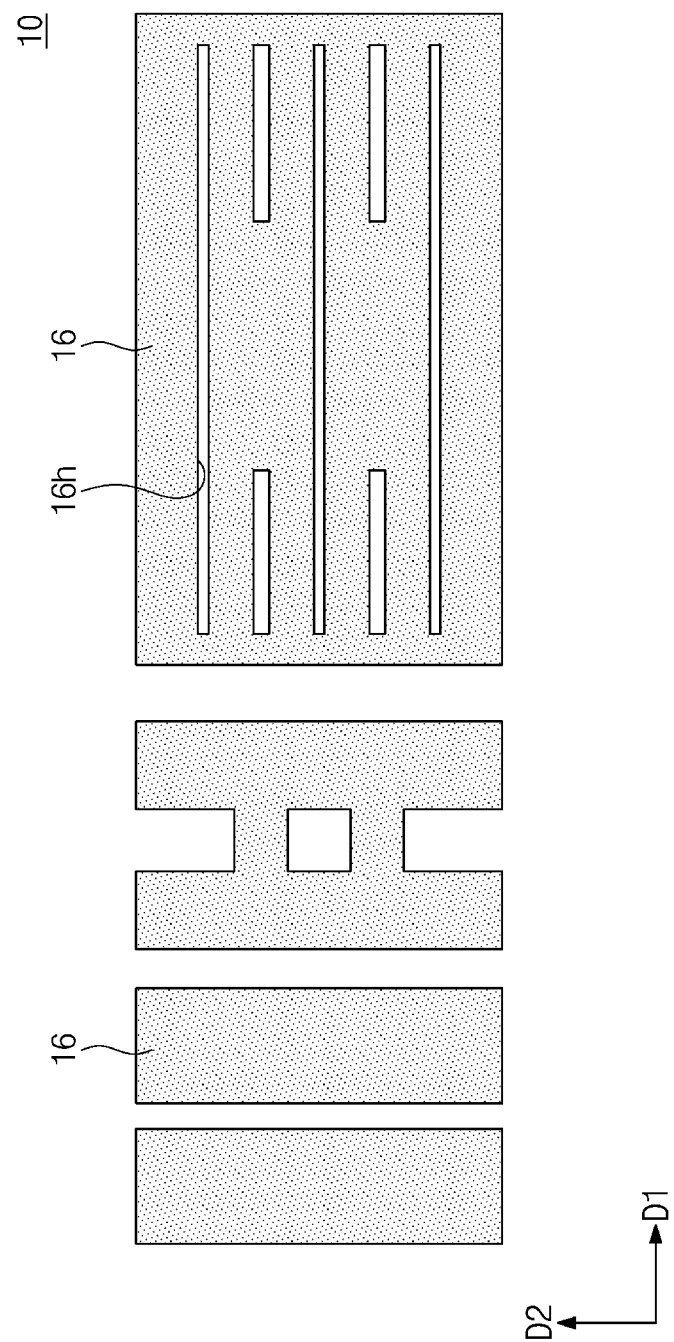

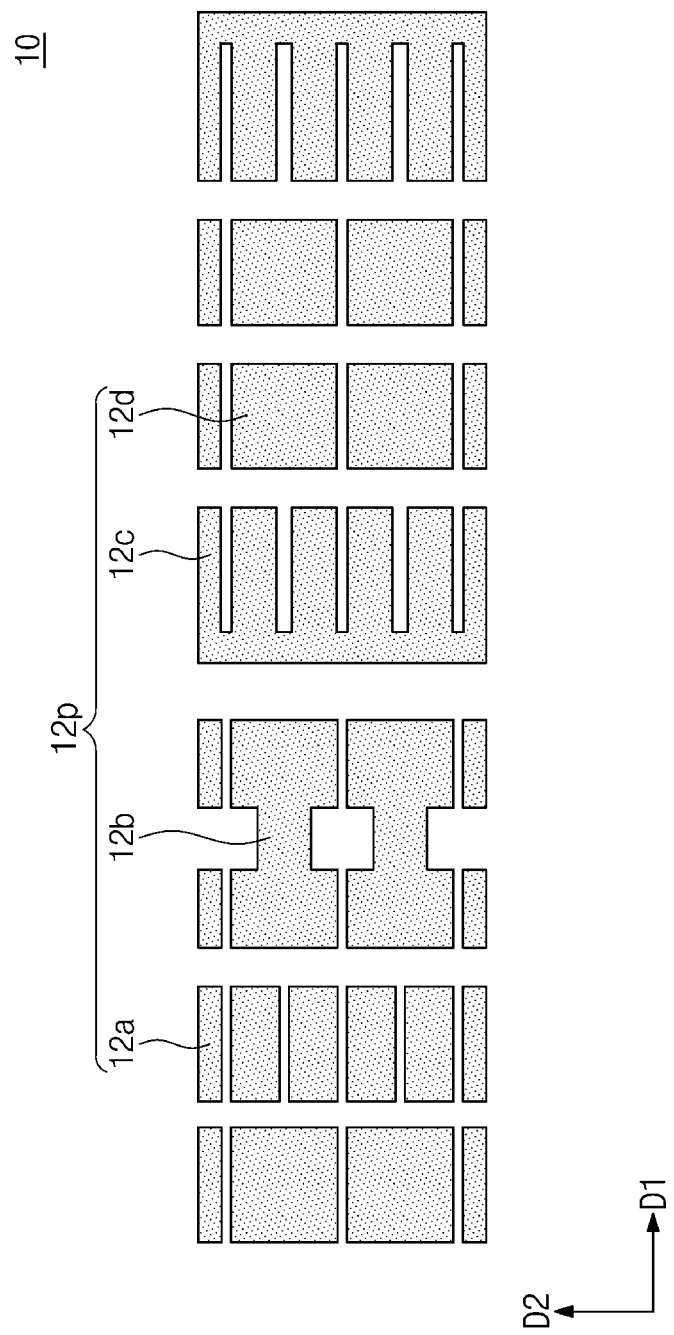

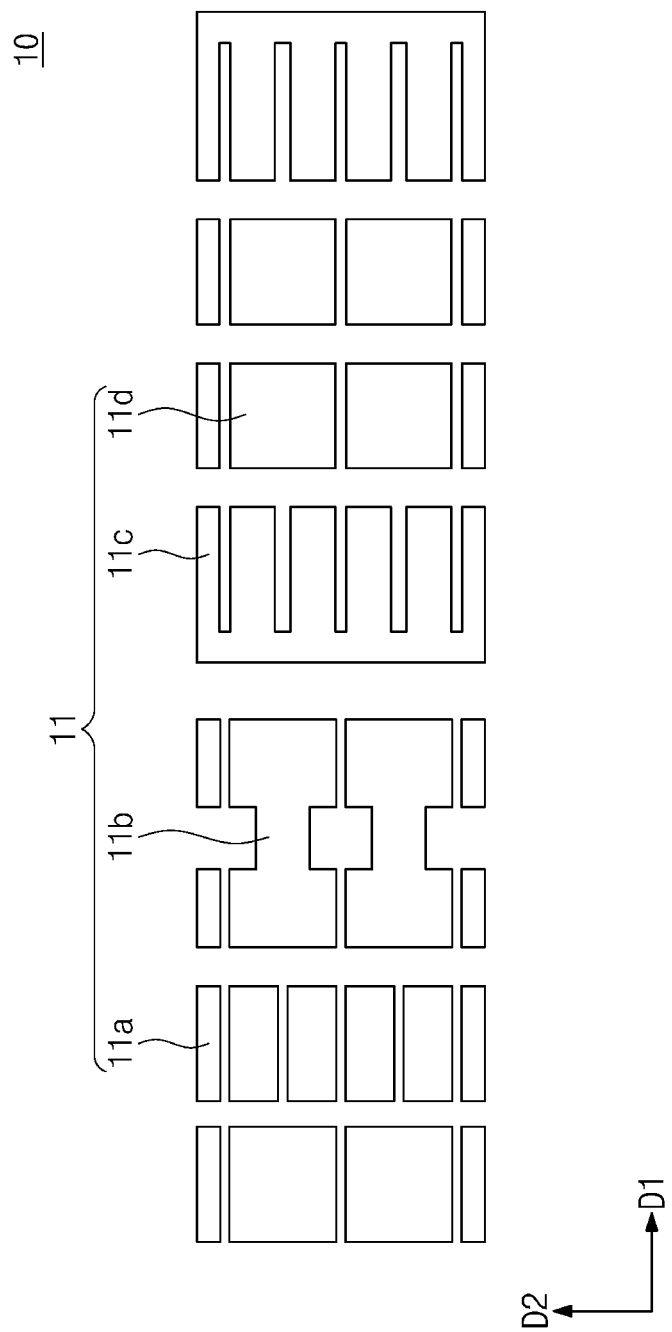

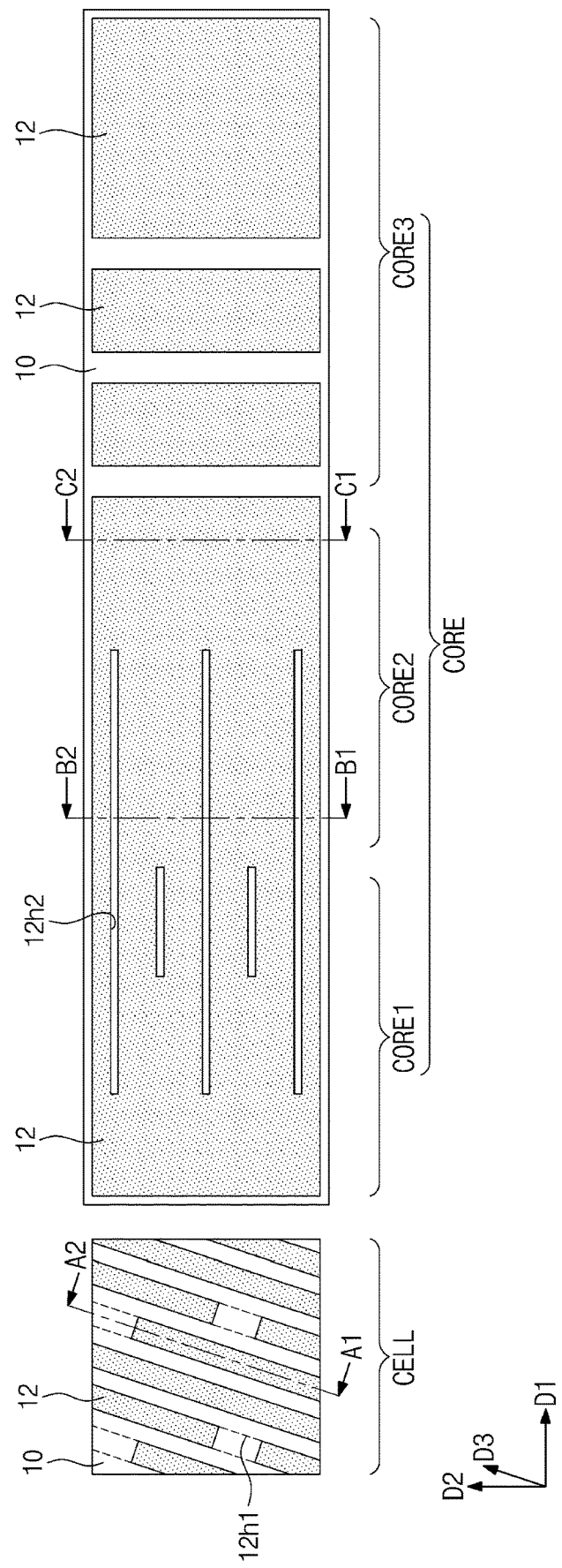

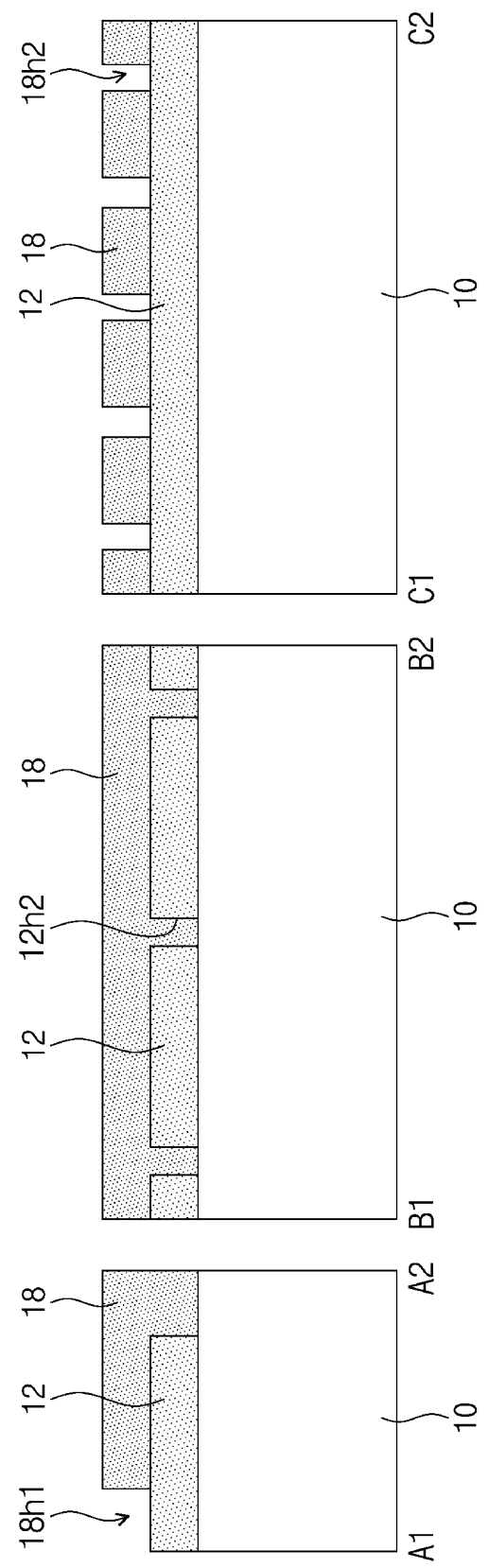

SEMICONDUCTOR DEVICE

CROSS-REFERENCE TO RELATED APPLICATION

This U.S. nonprovisional application claims priority under 35 U.S.C § 119 to Korean Patent Application No. 10-2019-0127954 filed on Oct. 15, 2019, in the Korean Intellectual Property Office, the disclosures of which are hereby incorporated by reference in their entirety.

FIELD

The present inventive concepts relate to semiconductor devices, and more particularly, to semiconductor devices including active patterns having no or reduced corner rounding.

BACKGROUND

When a substrate patterning process is performed to form an active pattern, it is typical that the active pattern has a rounded corner. The corner rounding may lead to contact between adjacent corners. In addition, the corner rounding may increase a size of the active pattern. The corner rounding may thereby be problematic with respect to device integration and/or electrical characteristics.

SUMMARY

Some example embodiments of the present inventive concepts provide a semiconductor device that includes an active pattern having no or reduced corner rounding.

Some example embodiments of the present inventive concepts provide a semiconductor device that includes an active pattern having improved electrical characteristics.

Some example embodiments of the present inventive concepts provide a semiconductor device that includes an active pattern having increased integration.

According to some example embodiments of the present inventive concepts, a semiconductor device may include: a substrate having an active pattern; a cell region on the substrate, the cell region having a cell circuit; and a core region on the substrate, the core region having a peripheral circuit. In plan view, the active pattern on the core region may include a plurality of corners. Each of the corners may have a rounding index that is equal to or less than about 15 nm. The rounding index may be a distance between a respective tip of the each of the corners and a right-angled corner.

According to some example embodiments of the present inventive concepts, a semiconductor device may include: a substrate that has a cell region and a core region; and active patterns on the cell region and on the core region. The core region may be divided into a plurality of regions. In plan view, the active patterns on each of the plurality of regions may include a plurality of corners. Each of the corners may have a rounding index that is equal to or less than about 15 nm. The rounding index may be a distance between a respective tip of the each of the corners and a right-angled corner.

According to some example embodiments of the present inventive concepts, a semiconductor device may include: a semiconductor substrate that includes a cell region on which a memory circuit is provided and a core region on which a peripheral circuit is provided; a plurality of cell active patterns on the cell region, the cell active patterns having a same shape and arranged regularly or spaced apart from one another; and a plurality of peripheral active patterns on the core region. In plan view, each of the peripheral active patterns may have a plurality of corners. Each of the corners may have a rounding index that is equal to or less than about 15 nm. The rounding index may be a distance between a respective tip of the each of the corners and a right-angled corner.

BRIEF DESCRIPTION OF THE DRAWINGS

FIGS. 1A, 1B, 1C, 1D, 1E, 1F, 1G, 1H, and 1I illustrate plan views showing substrate patterning methods according to some example embodiments of the present inventive concepts.

FIG. 1E illustrates an enlarged view showing section S1 of FIG. 1C.

FIG. 1F illustrates an enlarged view showing section S2 of FIG. 1D.

FIG. 1H illustrates an enlarged view showing section S3 of FIG. 1G.

FIG. 1I illustrates an enlarged view showing a portion of FIG. 1H.

FIGS. 2A, 2B, and 2C illustrate plan views showing substrate patterning methods according to some example embodiments of the present inventive concepts.

FIGS. 3A, 4A, 5A, 6A, 7A, 8A, 9A, 10A, and 11A illustrate plan views showing substrate patterning methods according to some example embodiments of the present inventive concepts.

FIGS. 3B, 4B, 5B, 6B, 7B, 8B, 9B, 10B, and 11B illustrate cross-sectional views taken along lines A1-A2, B1-B2, and C1-C2 of FIGS. 3A to 11A, respectively, showing substrate patterning methods according to some example embodiments of the present inventive concepts.

DETAILED DESCRIPTION OF EMBODIMENTS

The following will now describe substrate patterning methods to form an active pattern having no or reduced corner rounding and a semiconductor device including the active pattern according to some example embodiments of the present inventive concepts in conjunction with the accompanying drawings.

Figure 1A:
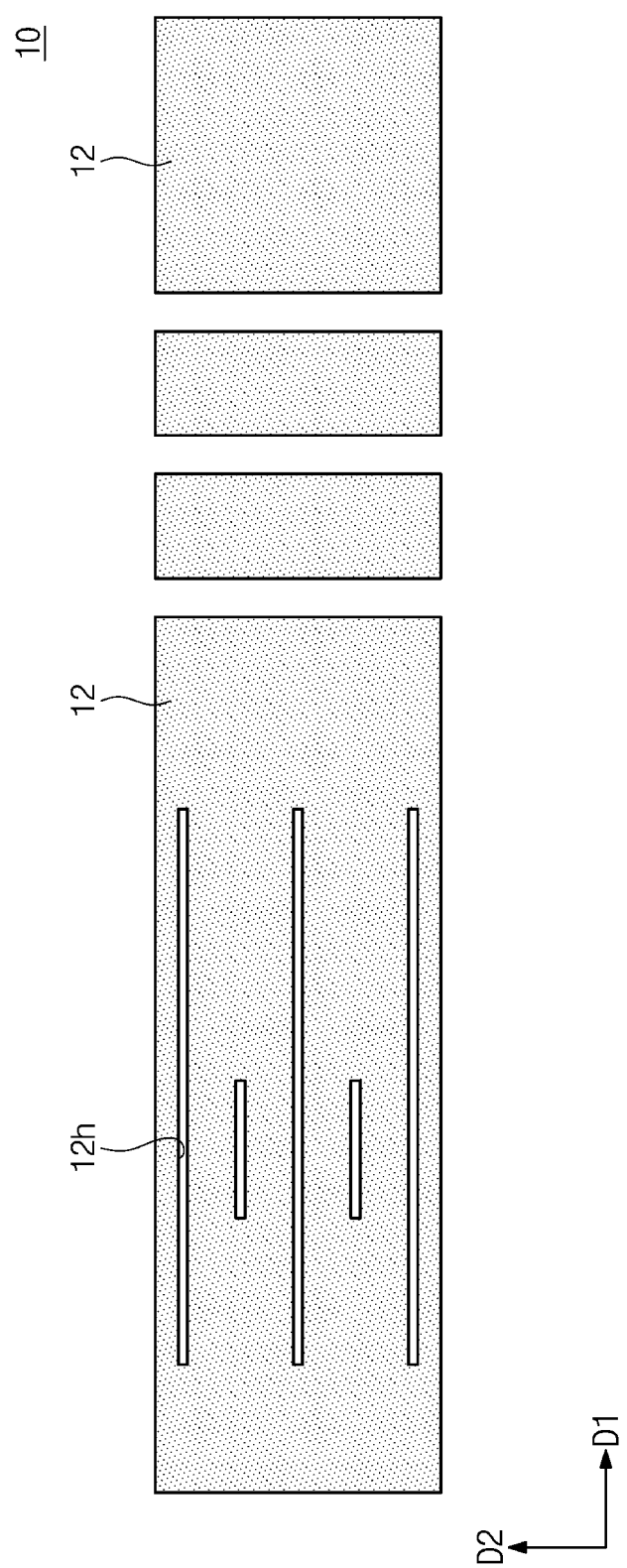
Figure 1B:
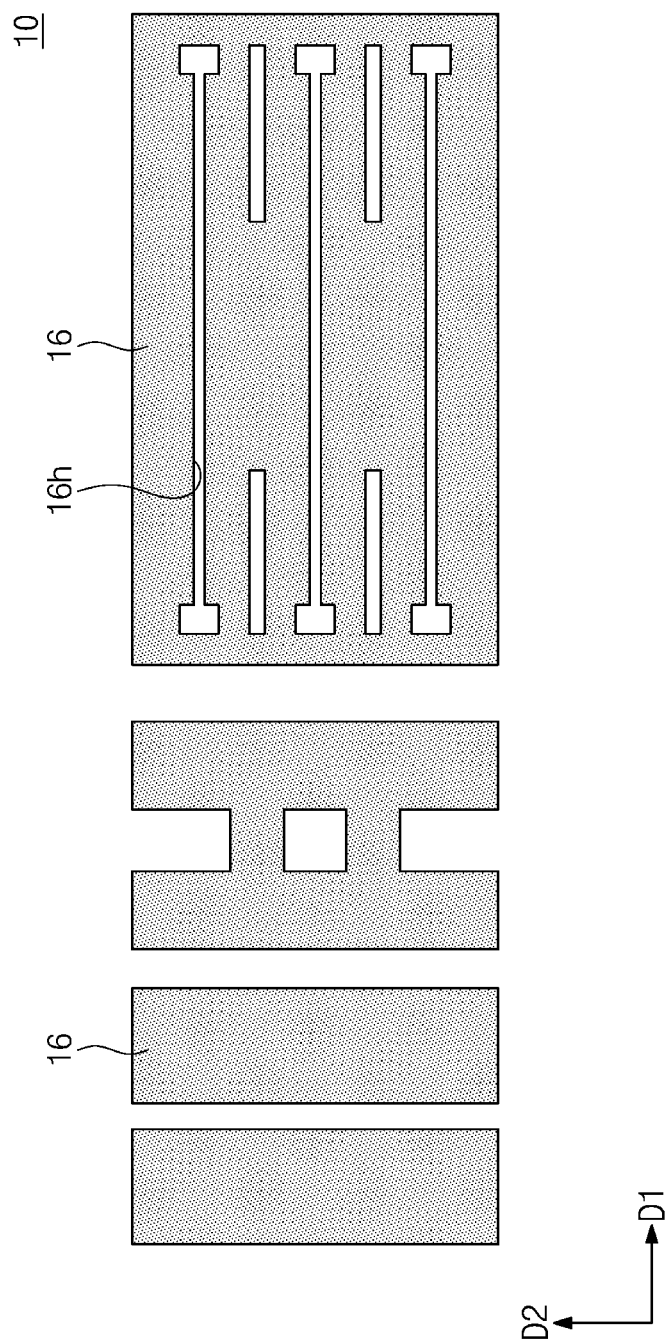
Figure 1D:
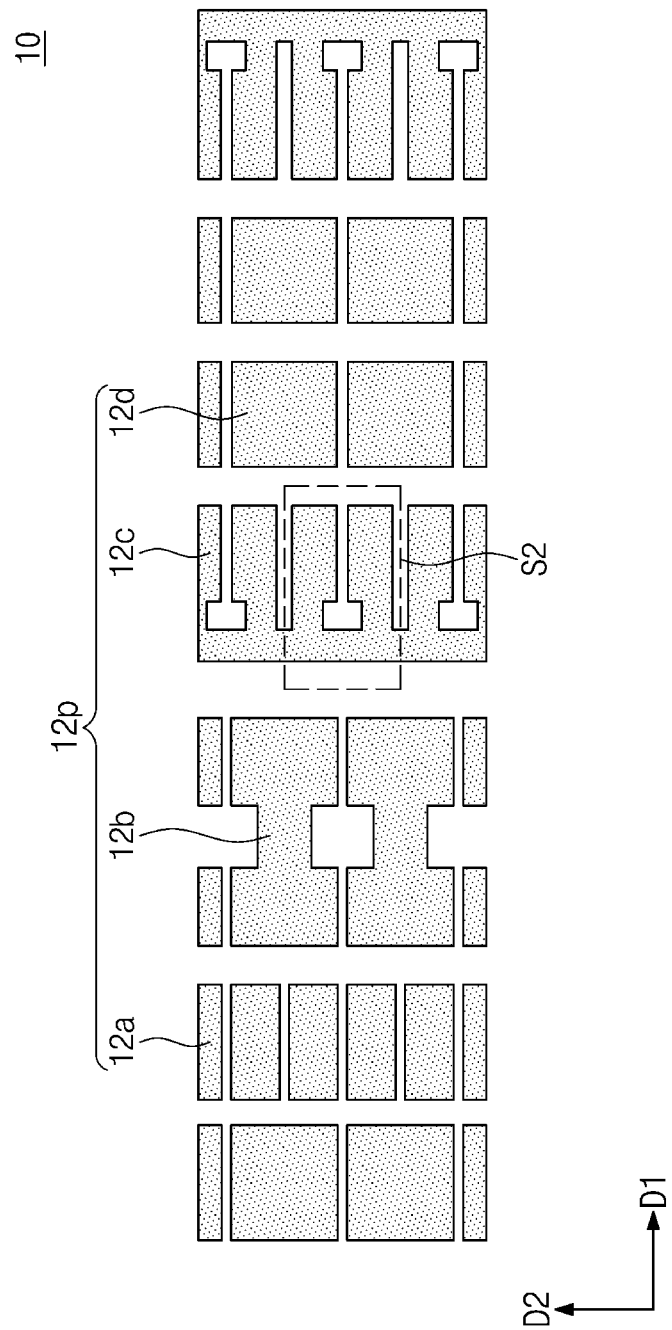
Figure 1E:
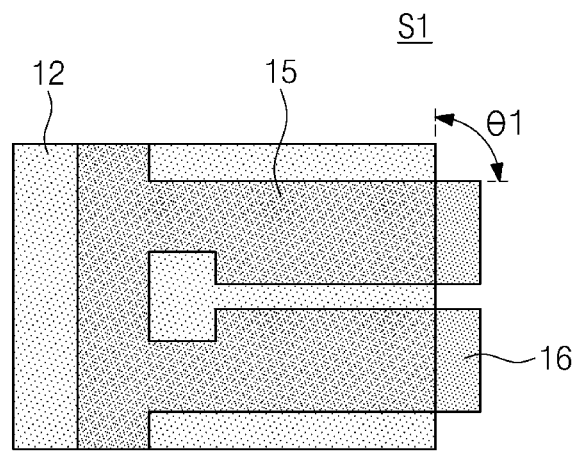
Figure 1F:
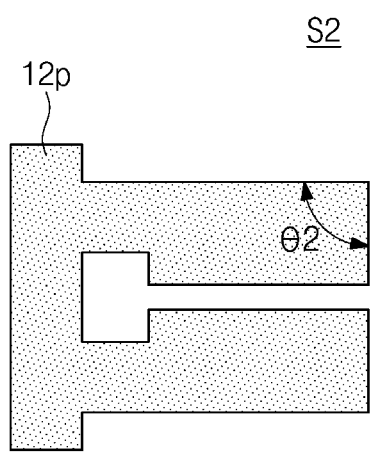
Figure 1G:
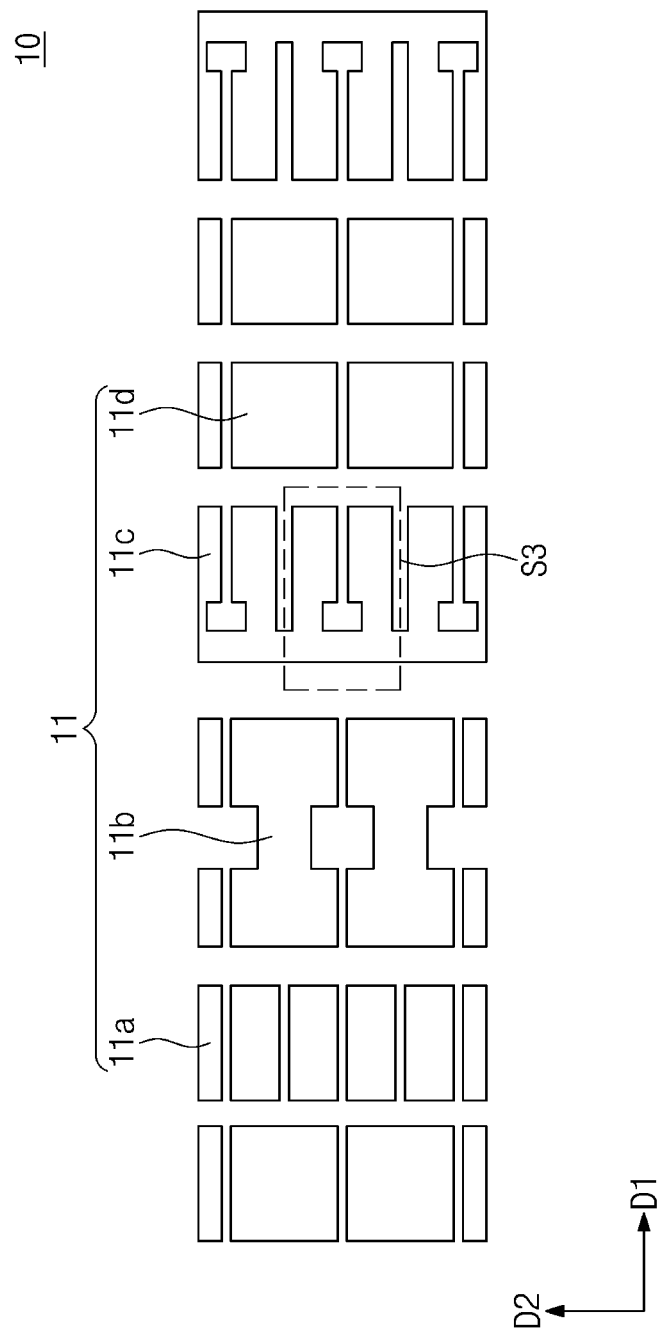
Figure 1H:
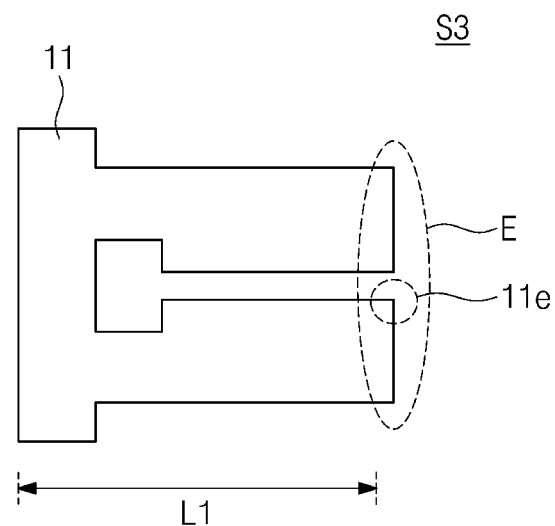
Figure 1I:
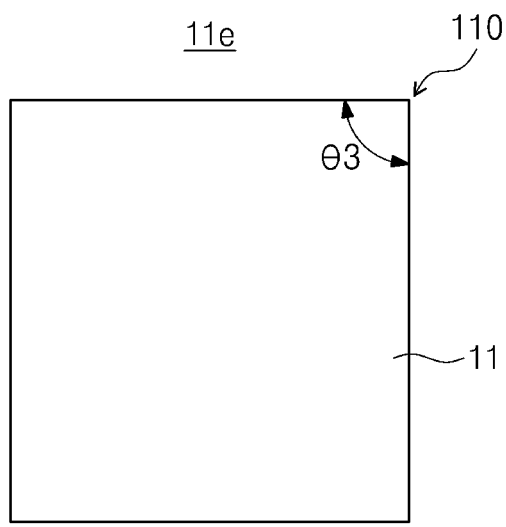

FIGS. 1A to 1I illustrate plan views showing substrate patterning methods according to some example embodiments of the present inventive concepts. FIG. 1E illustrates an enlarged view showing section S1 of FIG. 1C. FIG. 1F illustrates an enlarged view showing section S2 of FIG. 1D. FIG. 1H illustrates an enlarged view showing section S3 of FIG. 1G. FIG. 1K illustrates a plan view showing an active pattern according to a comparative example. FIG. 1I illustrates an enlarged view showing a portion of FIG. 1H.

Referring to FIG. 1A, a first mask 12 may be formed on a substrate 10. The terms first, second, etc. may be used herein to distinguish one element from another. The substrate 10 may be a semiconductor substrate including a semiconductor material such as silicon. Alternatively, the substrate 10 may be an etching target layer such as a conductive layer, a dielectric layer, or a combination thereof. The first mask 12 may have a plurality of tetragonal shapes and may include a plurality of openings 12h. A shape of the first mask 12 may be a combination of a tetragonal shape elongated along a first direction D1, a tetragonal shape elongated along a second direction D2 intersecting (or perpendicular to) the first direction D1, and a square shape or a similar shape thereto. The openings 12h may be arranged along the second direction D2, and a longitudinal axis of each of the openings 12h may extend along the first direction D1. Each of the openings 12h may have a respective width that is constant or almost constant along the first direction D1. The openings 12h may expose the substrate 10.

Referring to FIG. 1B, a second mask 16 may be formed on the substrate 10. A shape of the second mask 16 may be a combination of a tetragonal shape elongated along the second direction D2, a ladder shape elongated along the second direction D2, and a tetragonal shape elongated along the first direction D1. The second mask 16 may include a plurality of openings 16h. The openings 16h may be arranged along the second direction D2, and a longitudinal axis of each of the openings 16h may extend along the first direction D1. At least one of the openings 16h may have a shape whose opposite ends are expanded, i.e., greater in size (e.g., width) than portions of the openings 16h between the opposite ends. For example, ones of the openings 16h may have respective widths, each of which is constant or almost constant along the first direction D1. Others of the openings 16h may have respective widths, each of which is constant or almost constant along the first direction D1, and may have opposite ends that are expanded.

Referring to FIG. 1C, the second mask 16 may be formed on the first mask 12. The second mask 16 may have a shape that partially covers the first mask 12 and partially exposes the first mask 12. When viewed in plan (i.e., in plan view), the openings 16h of the second mask 16 may not overlap the openings 12h of the first mask 12. The openings 16h may expose one or more of the substrate 10 and the first mask 12. The second mask 16 may include a material having an etch selectivity with respect to the first mask 12. The first mask 12 may be patterned by an etching process in which the second mask 16 is used as an etching mask. After the first mask 12 is patterned, the second mask 16 may be removed.

Referring to FIG. 1D, the processes mentioned above may eventually form a mask pattern 12p having various shapes. For example, the mask pattern 12p may include at least one sub-pattern 12a having a rectangular shape or a similar shape thereto, at least one sub-pattern 12b having a dumbbell shape or a similar shape thereto, at least one sub-pattern 12c having a comb shape or a similar shape thereto, and at least one sub-pattern 12d having a square shape or a similar shape thereto.

According to some embodiments, the mask pattern 12p may include no rounded corners. Referring to FIG. 1E together with FIG. 1C, the first mask 12 may be patterned by an etching process that uses the second mask 16. In this case, the first and second masks 12 and 16 may overlap each other to form an overlapping section 15, and the overlapping section 15 may remain to constitute the mask pattern 12p illustrated in FIG. 1D. Because on the overlapping section 15 the first and second masks 12 and 16 may define a right-angle or an intersection angle θ1 similar thereto, the mask pattern 12p corresponding to the overlapping section 15 may have no or significantly reduced rounding shape as shown in FIG. 1F. For example, the mask pattern 12p may have a corner angle θ2 of 90° or almost 90°. As discussed above, the mask pattern 12p may be eventually constituted by the overlapping section 15 where the first and second masks 12 and 16 overlap each other. According to the previous principle, the sub-patterns 12a, 12b, 12c, and 12d of the mask pattern 12p may each include sharp (e.g., 90° or almost 90°) corners.

Referring to FIG. 1G, the substrate 10 may be patterned by an etching process in which the mask pattern 12p of FIG. 1D is used as an etching mask. The etching process may form an active pattern 11 on the substrate 10. The active pattern 11 may have various shapes. For example, the active pattern 11 may include at least one active pattern 11a having a rectangular shape or a similar shape thereto, at least one active pattern 11b having a dumbbell shape or a similar shape thereto, at least one active pattern 11c having a comb shape or a similar shape thereto, and at least one active pattern 11d having a square shape or a similar shape thereto.

As discussed above with reference to FIG. 1F, because the mask pattern 12p has sharp corners, the active pattern 11 may also have a sharp corner edge E as shown in FIG. 1H. As previously mentioned with reference to FIGS. 1A to 1D, when the first mask 12 is formed and then patterned by using the second mask 16 that partially overlaps the first mask 12, the mask pattern 12p may be formed to have sharp corners.

Referring to FIG. 1I, one corner 11e of the active pattern 11 may have an angle of 90° or a corner angle θ3 similar to 90°. For example, the corner 11e may have a sharp tip 110. The corner 11e may have a rounding index of 0 or almost 0 which will be discussed below with reference to FIG. 1J. The same may also be true for other corners of the active pattern 11.

Figure 1J:
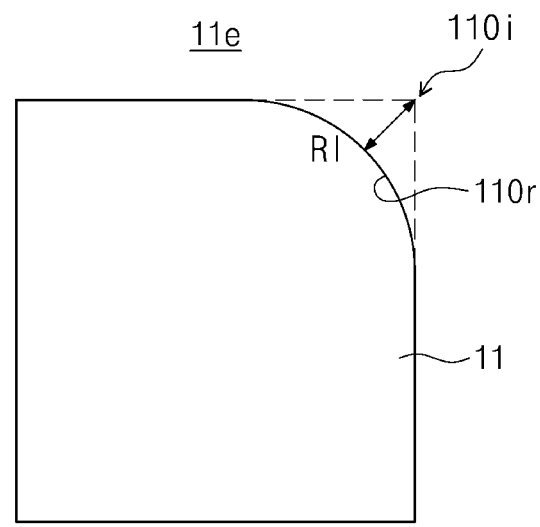
FIG. 1J illustrates an enlarged view showing a portion of FIG. 1H.
Figure 1K:
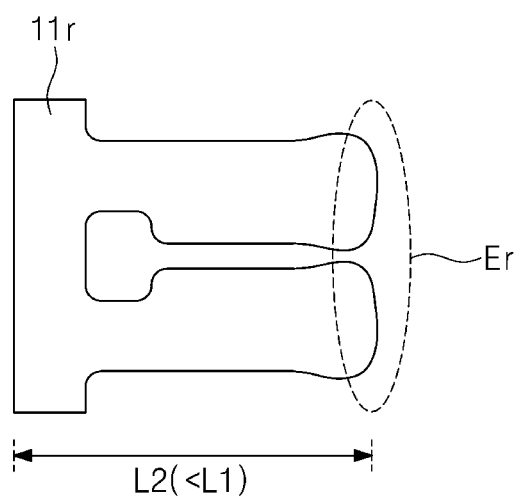
FIG. 1K illustrates a plan view showing an active pattern according to a comparative example.

Referring to FIG. 1J, the corner 11e of the active pattern 11 may be slightly rounded. The degree of rounding or curvature of the corner 11e may be expressed by a rounding index (RI). The rounding index (RI) may indicate a distance, e.g., a minimum distance, between a rounded tip 110r and an imaginary tip 110i, e.g., of or defining a right-angled corner. The position of the imaginary tip 110i may denote a point at which is provided a tip of the corner 11e that is not rounded. For example, the imaginary tip 110i may correspond to the tip 110 of FIG. 1I. The rounding index (RI) may be equal to or less than about 15 nm. For example, the rounding index (RI) may range from about 5 nm to about 15 nm.

As discussed above, according to some embodiments of the present inventive concepts, the corner 11e of the active pattern 11 may have either the sharp tip 110 as shown in FIG. 1I or the rounded tip 110r as shown in FIG. 1J. Because the rounding index (RI), or the degree of rounding, is reduced to about 15 nm or less, as discussed below with reference to FIG. 1K, issues associated with the corner rounding may be solved even when the corner 11e has the rounded tip 110r.

Differently from or in contrast to some embodiments of the present inventive concepts, when a single patterning process forms a mask pattern similar to the mask pattern 12p of FIG. 1D, the similar mask pattern may have rounded corners. The degree of rounding may be greater than that of FIG. 1J. When a substrate is etched by using the mask pattern having the rounded corners, an active pattern 11r may be formed to have a rounded corner edge Er as shown in FIG. 1K.

The corner rounding may expand the corner edge Er of the active pattern 11r according to a comparative example, and thus the active pattern 11r may have a length L2 relatively greater than a length (see L1 of FIG. 1H) of the active pattern 11 according to the present embodiment. The increase in length of the active pattern 11r may lead to an increase in area of the active pattern 11r, and may thus act as an obstacle to integration of a semiconductor device. In addition, the expansion of corners of the active pattern 11r may induce contact between adjacent corners of the active pattern 11r or between corners of neighboring active patterns 11r, which may results in degradation in electrical characteristics of a semiconductor device.

In contrast, the present embodiment may prevent problems such as the increase in length and/or the contact between corners of the active pattern 11r according to a comparative example. As a result, a semiconductor device with the active pattern 11 having the sharp corners may provide an improvement in integration and electrical characteristics.

FIGS. 2A to 2C illustrate plan views showing substrate patterning methods according to some example embodiments of the present inventive concepts.

Referring to FIG. 2A, each opening 16h of the second mask 16 may have a width that is constant or almost constant along the first direction D1. The comb-like sub-pattern 12c of the mask pattern 12p of FIG. 2B formed by using the second mask 16 may have a shape different from that of the comb-like sub-pattern 12c of FIG. 1D. Likewise, the comb-like active pattern 11c of the active pattern 11 of FIG. 2C formed by using the mask pattern 12p of FIG. 2B may have a shape different from that of the comb-like active pattern 11c of FIG. 1G. Except as discussed above, the description with reference to FIGS. 1A to 1J may be identically or similarly applicable to the present embodiment, e.g., with respect to the shapes 12a/11a, 12b/11b, and 12d/11d.

Figure 2D:
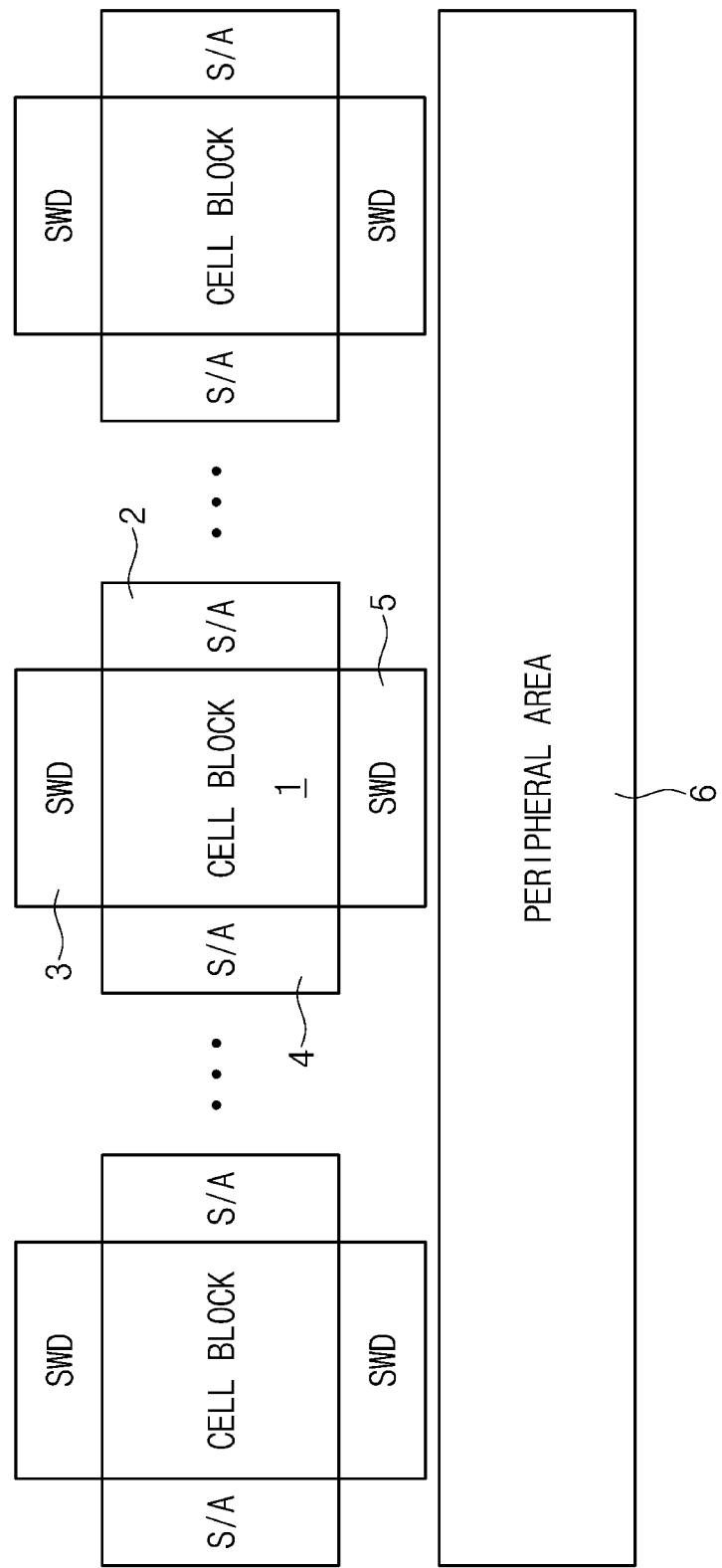
FIG. 2D illustrates a block diagram showing a semiconductor device according to some example embodiments of the present inventive concepts.

FIG. 2D illustrates a block diagram showing a semiconductor device according to some example embodiments of the present inventive concepts.

Referring to FIG. 2D, a semiconductor device may include one or more cell region 1, core regions 2, 3, 4, and 5, and a peripheral region 6. The semiconductor device may be, for example, a memory device. The cell region 1 may include a cell circuit, such as a memory integrated circuit. The core regions 2, 3, 4, and 5 and the peripheral region 6 may be electrically connected to the cell region 1, and may include various peripheral circuits required for operation of the cell circuit included in the cell region 1.

The core regions 2, 3, 4, and 5 may include a first core region 2, a second core region 3, a third core region 4, and a fourth core region 5 that surround the cell region 1. The first to fourth core regions 2 to 5 may include sense amplifier (S/A) circuits, sub-word line driver (SWD) circuits, and power and ground circuits for driving the sense amplifier. For example, the sense amplifier (S/A) circuits may be disposed on the first and third core regions 2 and 4 that face each other, and the sub-word line driver (SWD) circuits may be disposed on the second and fourth core regions 3 and 5 that face each other, but the present inventive concepts are not limited thereto. The power and ground circuits for driving the sense amplifier may be disposed either on the second and fourth core regions 3 and 5 or on the peripheral region 6.

The mask pattern 12p shown in FIG. 1D or 2B may be used to form active patterns on the core regions 2, 3, 4, and 5 and/or the peripheral region 6 of the semiconductor device illustrated in FIG. 2D. For example, each of the core regions 2, 3, 4, and 5 may be provided thereon with the active pattern 11 identical or similar to that shown in FIG. 2C. Similarly, the peripheral region 6 may be provided thereon with the active pattern 11 identical or similar to that shown in FIG. 2C. The active pattern 11 on each of the core regions 2, 3, 4, and 5 may be denser (e.g., in terms of active patterns or circuits per area or volume) than the active pattern 11 on the peripheral region 6.

The formation of the mask pattern 12p may include a patterning process to form the first mask 12 and a patterning process to form the second mask 16. These patterning processes may be performed simultaneously with a patterning process on the cell region 1. Therefore, it may not be required that a patterning process be newly introduced to form the mask pattern 12p separately. In conclusion, according to the present embodiment, the formation of active patterns on the core regions 2, 3, 4, and 5 and/or the peripheral region 6 may be performed compatible with the formation of an active pattern on the cell region 1. This will be further discussed in detail below.

FIGS. 3A to 11A illustrate plan views showing substrate patterning methods according to some example embodiments of the present inventive concepts. FIGS. 3B to 11B illustrate cross-sectional views taken along lines A1-A2, B1-B2, and C1-C2 of FIGS. 3A to 11A, respectively, showing substrate patterning methods according to some example embodiments of the present inventive concepts.

Figure 3A:
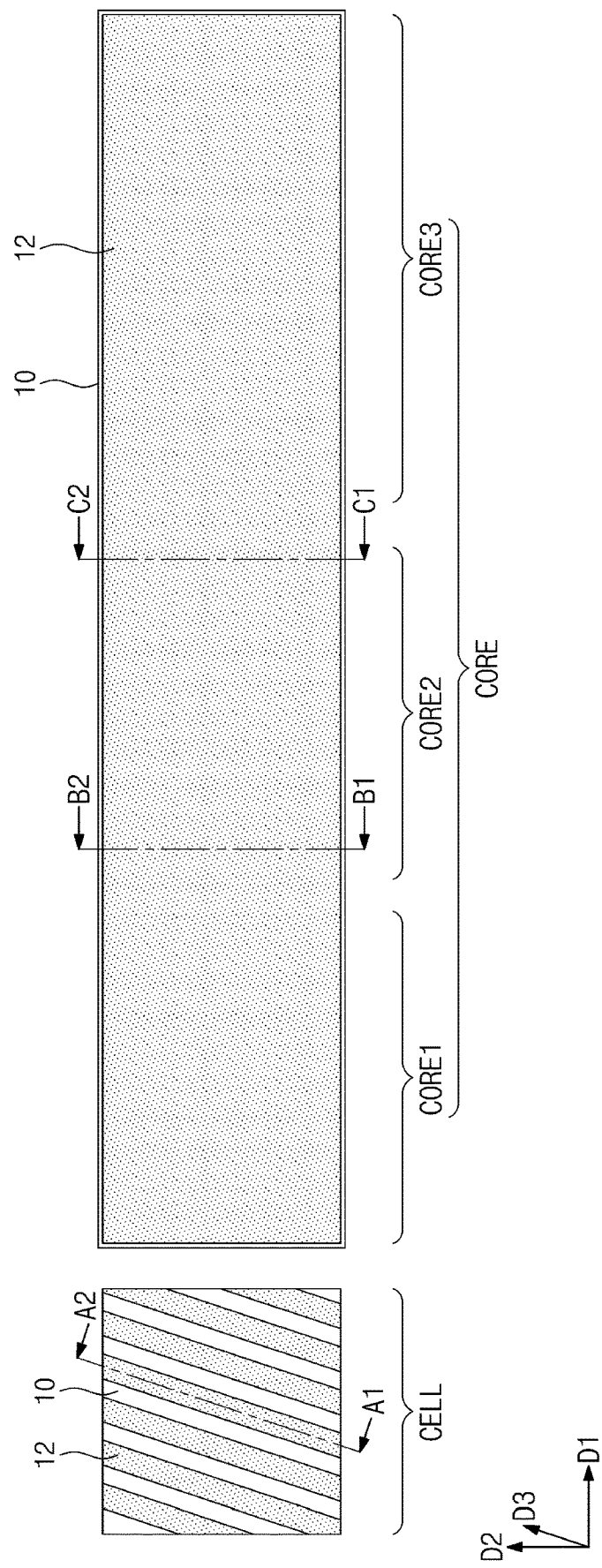
Figure 3B:
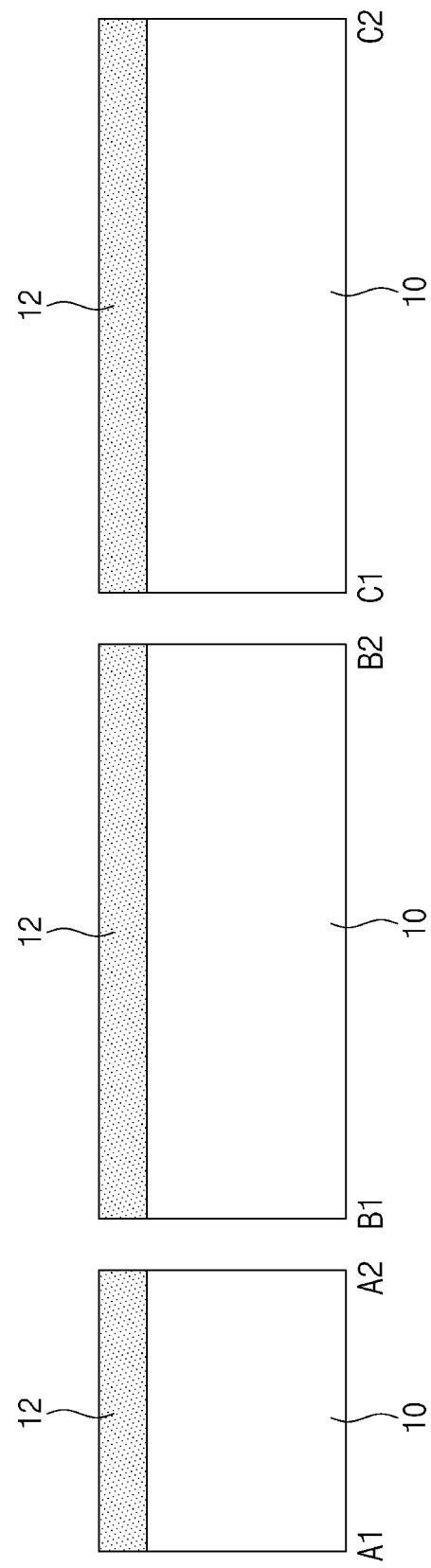

Referring to FIGS. 3A and 3B, a first mask 12 may be formed on a substrate 10. The substrate 10 may be a semiconductor substrate including a semiconductor material, such as silicon, germanium, or silicon-germanium. The substrate 10 may be an etching target layer, such as a conductive layer, a dielectric layer, or a combination thereof, or alternatively an etching target layer may be formed on the substrate 10.

The substrate 10 may be divided into a cell region CELL and a core region CORE. For convenience, the core region CORE may be divided into a first region CORE1, a second region CORE2, and a third region CORE3. The first, second, and third regions CORE1, CORE2, and CORE3 may be disposed on one side of the cell region CELL, or on a plurality of sides of the cell region CELL. For example, the cell region CELL may correspond to the cell region 1 of FIG. 2D, and the core region CORE may correspond to one or more of the core regions 2, 3, 4, and 5 of FIG. 2D.

In this disclosure, for convenience of description and illustration, the first, second, and third regions CORE1, CORE2, and CORE3 may be arranged along a first direction D1, but the present inventive concepts are not limited thereto. For example, one of the first, second, and third regions CORE1, CORE2, and CORE3 may correspond to the first core region 2 or the third core region 4 of FIG. 2D, and another of the first, second, and third regions CORE1, CORE2, and CORE3 may correspond to the second core region 3 or the fourth core region 5 of FIG. 2D.

For example, a sense amplifier may be disposed on one of the first, second, and third regions CORE1, CORE2, and CORE3, a sub-word line driver may be disposed on another of the first, second, and third regions CORE1, CORE2, and CORE3, and power and ground drivers for driving the sense amplifier may be disposed on the other of the first, second, and third regions CORE1, CORE2, and CORE3.

The first mask 12 may be formed on the cell region CELL and the core region CORE. For example, on the cell region CELL, the first mask 12 may have a shape including a plurality of lines that extend along a third direction D3, and on the core region CORE, the first mask 12 may have a plate shape that wholly covers portions of the substrate 10 that are within the boundaries of the first mask 12. On the cell region CELL, the substrate 10 may be exposed between lines that are defined by the first mask 12. The first mask 12 may include an oxide layer, a nitride layer, an amorphous carbon layer, or a combination of ones of the oxide, nitride, and amorphous carbon layers that are formed by atomic layer deposition (ALD), chemical vapor deposition (CVD), or spin coating.

Figure 4A:
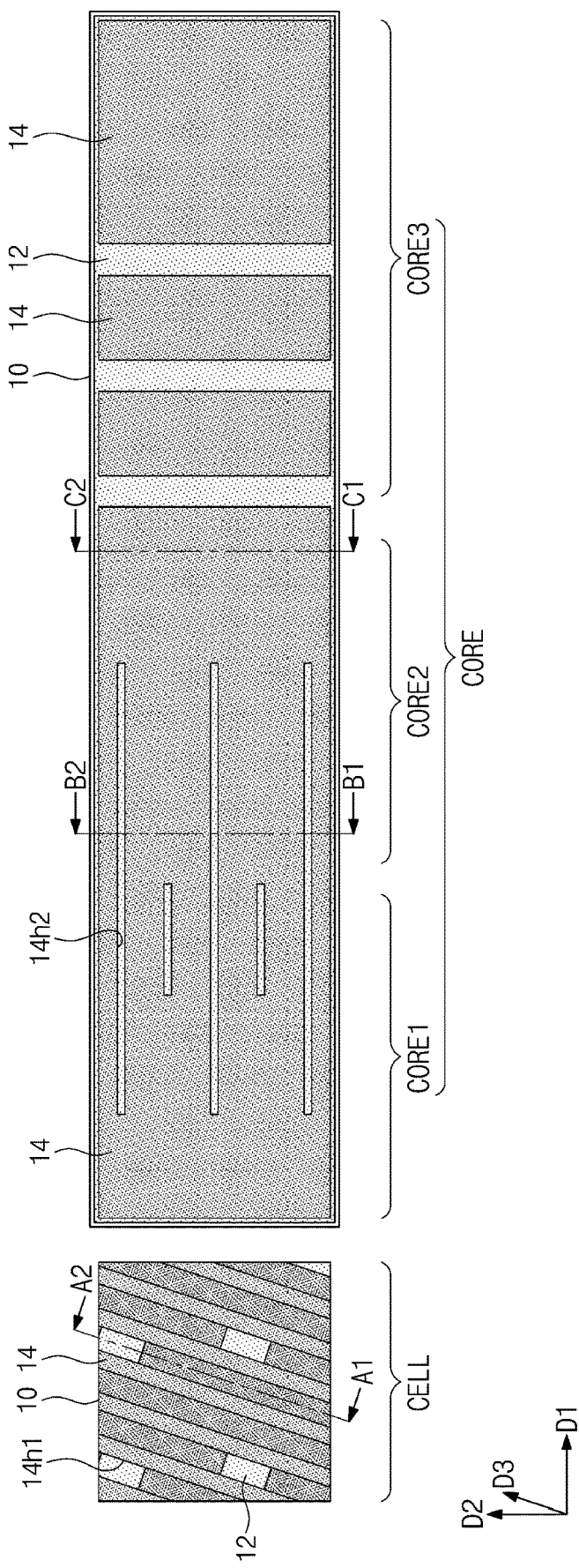
Figure 4B:
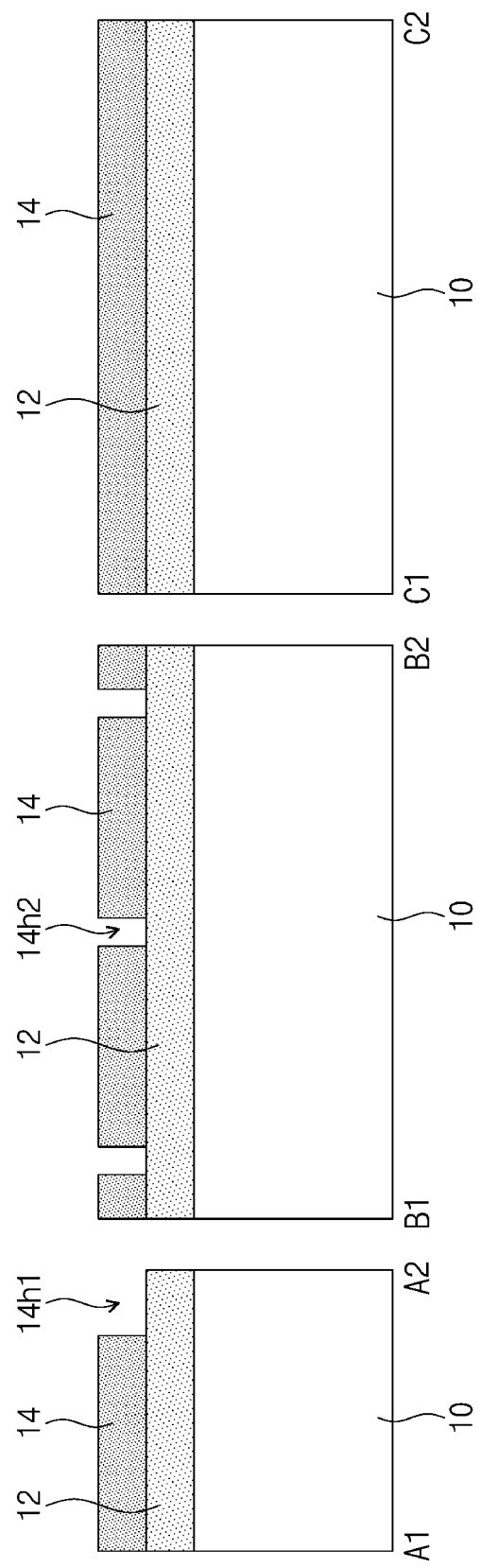

Referring to FIGS. 4A and 4B, a first photoresist pattern 14 may be formed on the substrate 10. The first photoresist pattern 14 may be formed on the cell region CELL and the core region CORE. For example, on the cell region CELL, the first photoresist pattern 14 may have a continuous shape that exposes portions of the first mask 12, and on the core region CORE, the first photoresist pattern 14 may have a discrete shape that exposes portions of the first mask 12.

On the cell region CELL, the first photoresist pattern 14 may include a plurality of first openings $14h1$. The first openings $14h1$ may be arranged spaced apart from each other along the first direction D1 or a second direction D2. Each of the first openings $14h1$ may have a tetragonal, circular, oval, polygonal, or any other shape that exposes a portion of the first mask 12.

On the core region CORE, the first photoresist pattern 14 may include a plurality of second openings $14h2$. The second openings $14h2$ may be arranged spaced apart from each other along the second direction D2, and each of the second openings $14h2$ may extend along the first direction D1 and expose a portion of the first mask 12. Each of the second openings $14h2$ may have a width that is constant or almost constant along the first direction D1.

Figure 5B:
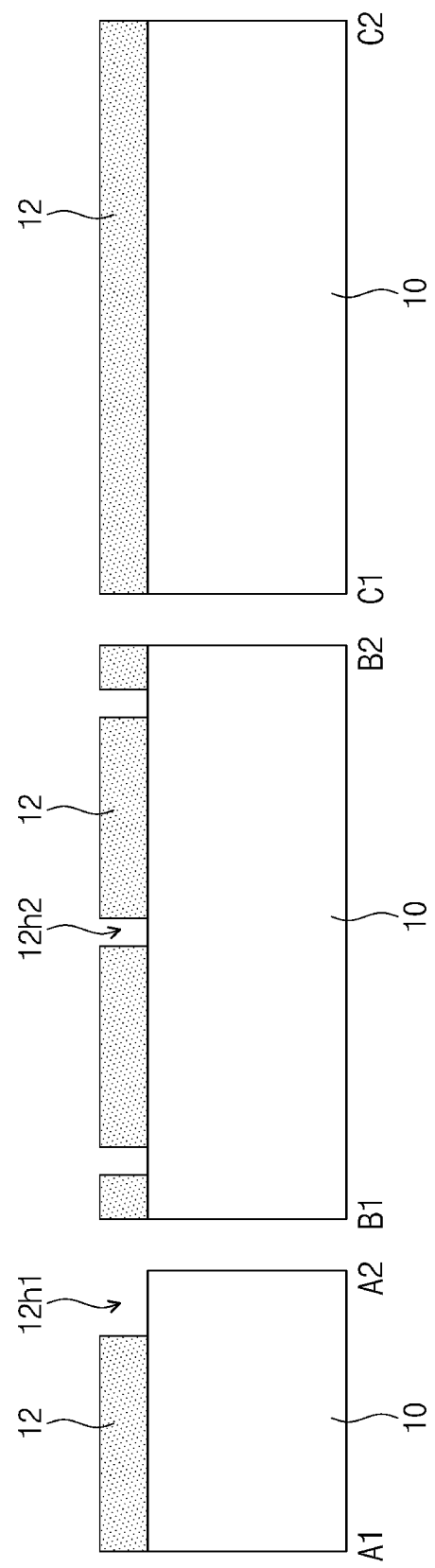

Referring to FIGS. 5A and 5B, the first mask 12 may be patterned by an etching process in which the first photoresist pattern 14 is used as an etching mask, and then the first photoresist pattern 14 may be removed. The etching process may include a dry etching process or a reactive ion etching process. An ashing or strip process may be used to remove the first photoresist pattern 14 from the substrate 10.

On the cell region CELL, the patterned first mask 12 may have a shape having a plurality of lines one or more of which are cut. For example, the patterned first mask 12 may have one or more first openings $12h1$. The substrate 10 may be exposed through the first openings $12h1$. The first openings $12h1$ may be cutting regions that fractionally divide the patterned first mask 12 having a linear shape elongated along the third direction D3. Therefore, on the cell region CELL, the first mask 12 may have a discontinuous shape that is cut by the first openings $12h1$.

On the core region CORE, the patterned first mask 12 may have a shape identical or similar to that of the first photoresist pattern 14. For example, the patterned first mask 12 may have a discrete shape that exposes portions of the substrate 10. The patterned first mask 12 may include a plurality of second openings $12h2$. The second openings $12h2$ may be arranged spaced apart from each other along the second direction D2, and each of the second openings $12h2$ may extend along the first direction D1 and expose a portion of the substrate 10. Each of the second openings $12h2$ may have a width that is constant or almost constant along the first direction D1. The description of the first mask 12 discussed above with reference to FIG. 1A may be identically or similarly applicable to the patterned first mask 12.

Figure 6A:
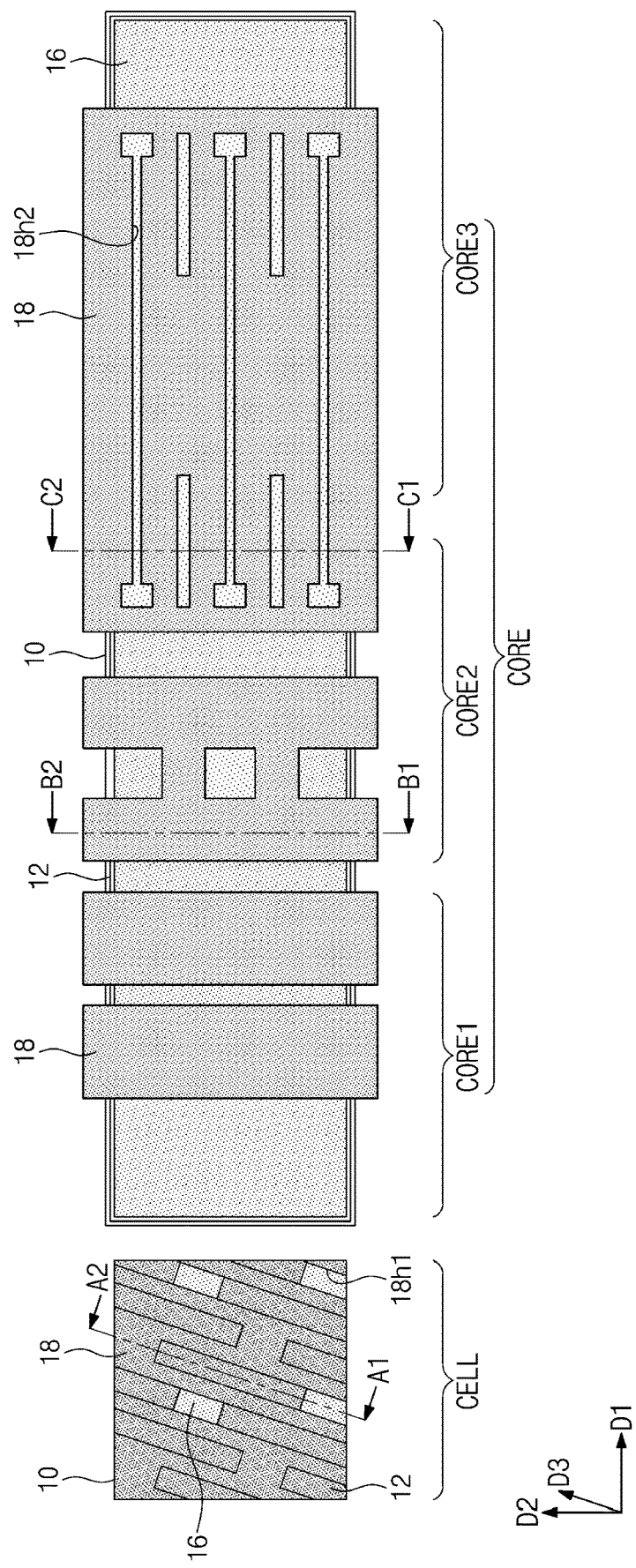
Figure 6B:
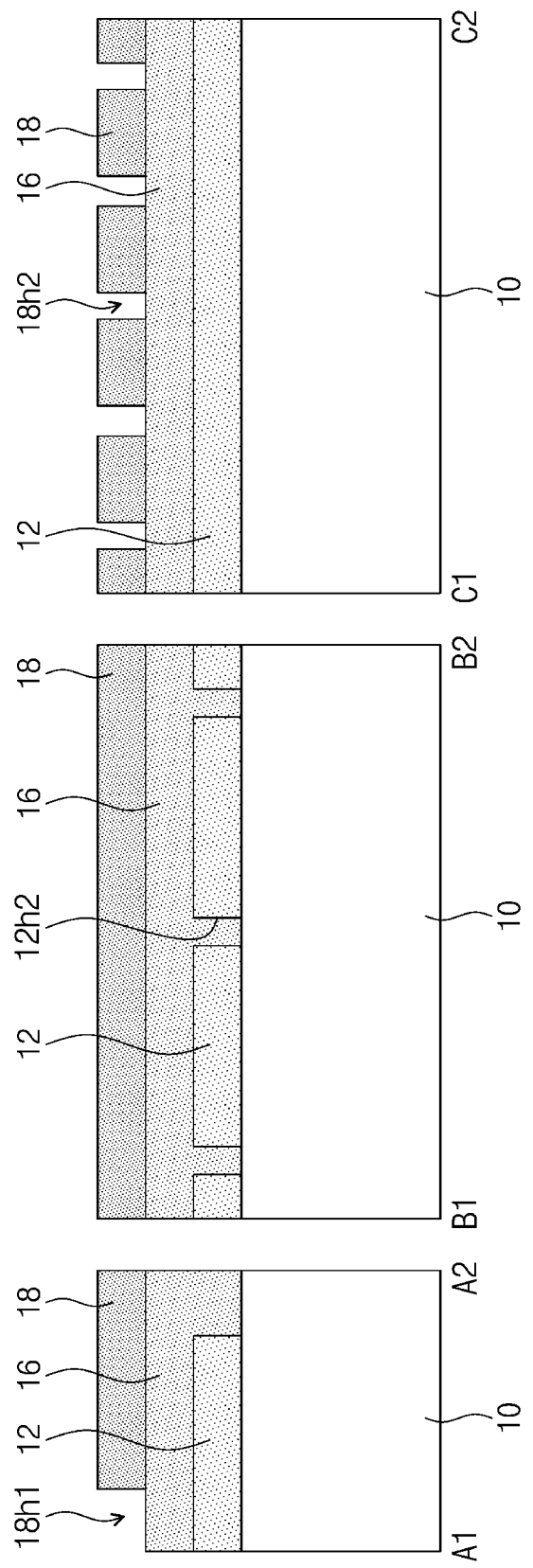

Referring to FIGS. 6A and 6B, a second mask 16 may be formed on the substrate 10, and a second photoresist pattern 18 may be formed on the second mask 16. The second mask 16 may have a plate shape that wholly covers portions of the cell region CELL and the core region CORE that are within the boundaries of the second mask 16. The second mask 16 may include an oxide layer, a nitride layer, an amorphous carbon layer, or a combination of ones of the oxide, nitride, and amorphous carbon layers that are formed by atomic layer deposition (ALD), chemical vapor deposition (CVD), or spin coating. The second mask 16 may have an etch selectivity with respect to the patterned first mask 12.

The second photoresist pattern 18 may be formed on the cell region CELL and the core region CORE. For example, on the cell region CELL, the second photoresist pattern 18 may have a continuous shape that exposes portions of the second mask 16, and on the core region CORE, the second photoresist pattern 18 may have a discrete shape that exposes portions of the second mask 16.

On the cell region CELL, the second photoresist pattern 18 may include a plurality of first openings $18h1$. The first openings $18h1$ may be arranged spaced apart from each other along the first direction D1 or the second direction D2. Each of the first openings $18h1$ may have a tetragonal, circular, oval, polygonal, or any other shape that exposes a portion of the second mask 16. The first openings $18h1$ of the second photoresist pattern 18 and the first openings $12h1$ of the patterned first mask 12 may be disposed in a staggered arrangement along the first direction D1 or the second direction D2. For example, in plan view, the first openings $18h1$ of the second photoresist pattern 18 may not overlap the first openings $12h1$ of the patterned first mask 12.

On the core region CORE, the second photoresist pattern 18 may include a plurality of second openings $18h2$. The second openings $18h2$ may be arranged spaced apart from each other along the second direction D2, and each of the second openings $18h2$ may extend along the first direction D1 and expose a portion of the second mask 16. Ones of the second openings $18h2$ may have respective widths, each of which is constant or almost constant along the first direction D2. Others of the second openings $18h2$ may have respective widths, each of which is constant or almost constant along the first direction D1 and is expanded, i.e., greater in size, at its opposite ends.

Figure 7A:
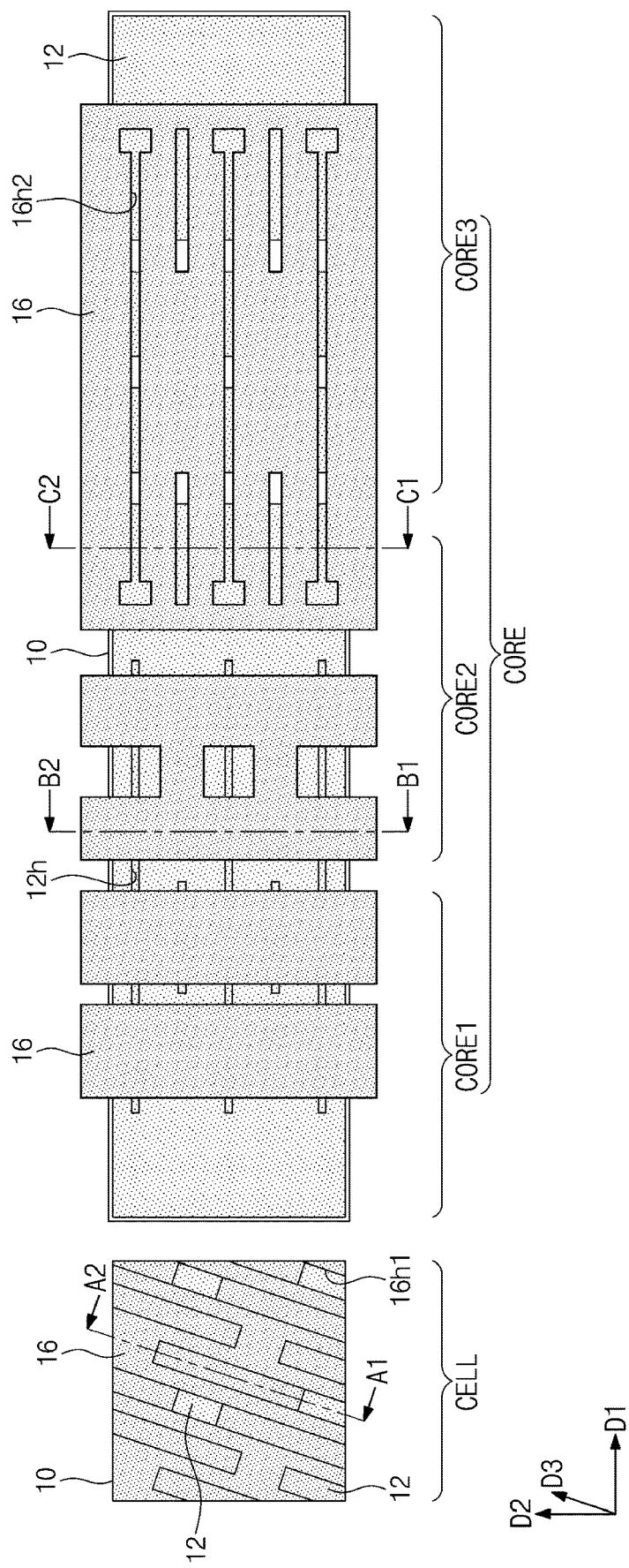
Figure 7B:
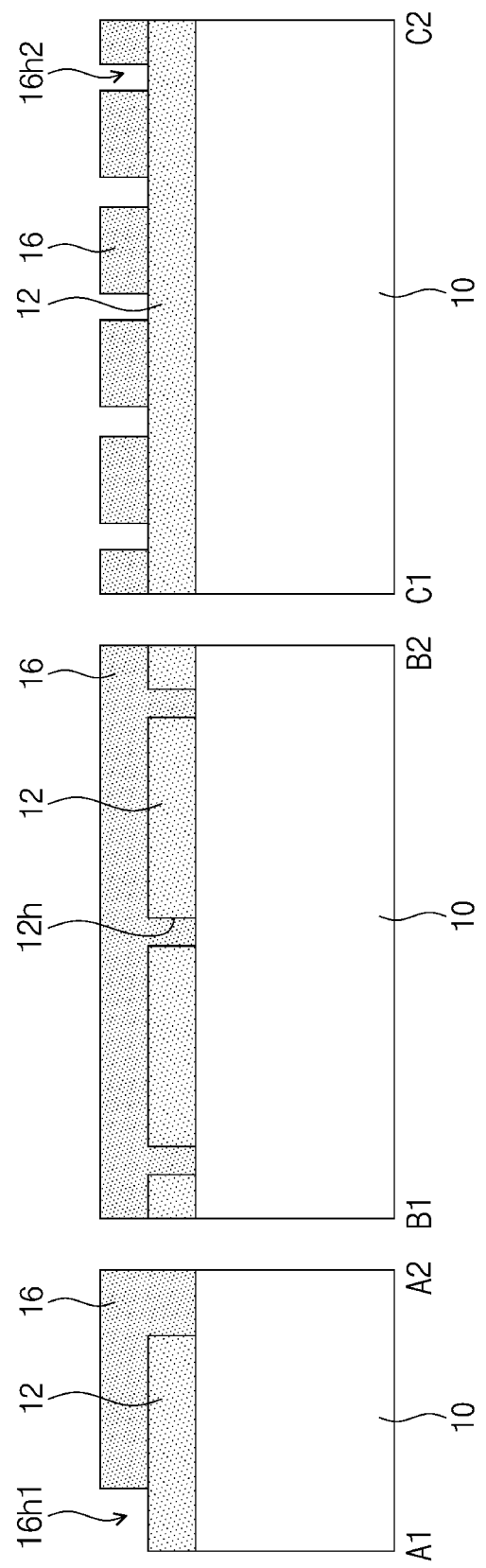

Referring to FIGS. 7A and 7B, the second mask 16 may be patterned by an etching process in which the second photoresist pattern 18 is used as an etching mask, and then the second photoresist pattern 18 may be removed. The etching process may include a dry etching process or a reactive ion etching process. An ashing or strip process may remove the second photoresist pattern 18 from the substrate 10.

On the cell region CELL, the patterned second mask 16 may have a plate shape that includes a plurality of first openings $16h1$. The patterned first mask 12 may be exposed through the first openings $16h1$.

The first openings $16h1$ may be arranged spaced apart from each other along the first direction D1 or the second direction D2. Each of the first openings $16h1$ may have a tetragonal, circular, oval, polygonal, or any other shape that exposes a portion of the patterned first mask 12. The first openings $16h1$ of the patterned second mask 16 and the first openings $12h1$ of the patterned first mask 12 may be disposed in a staggered arrangement along the first direction D1 or the second direction D2. For example, in plan view, the first openings 16h1 of the patterned second mask 16 may not overlap the first openings (see 12h1 of FIG. 5A) of the patterned first mask 12.

On the core region CORE, the patterned second mask 16 may have a shape identical or similar to that of the second photoresist pattern 18. For example, the patterned second mask 16 may have a discrete shape that exposes portions of the patterned first mask 12. The patterned second mask 16 may include a plurality of second openings 16h2. The second openings 16h2 may be arranged spaced apart from each other along the second direction D2, and each of the second openings 16h2 may extend along the first direction D1 and expose a portion of the patterned first mask 12. Ones of the second openings 16h2 may have respective widths, each of which is constant or almost constant along the first direction D1. Others of the second openings 16h2 may have respective widths, each of which is constant or almost constant along the first direction D1 and is expanded, i.e., greater in size, at its opposite ends. The description of the second mask 16 discussed above with reference to FIG. 1B may be identically or similarly applicable to the patterned second mask 16.

Figure 8A:
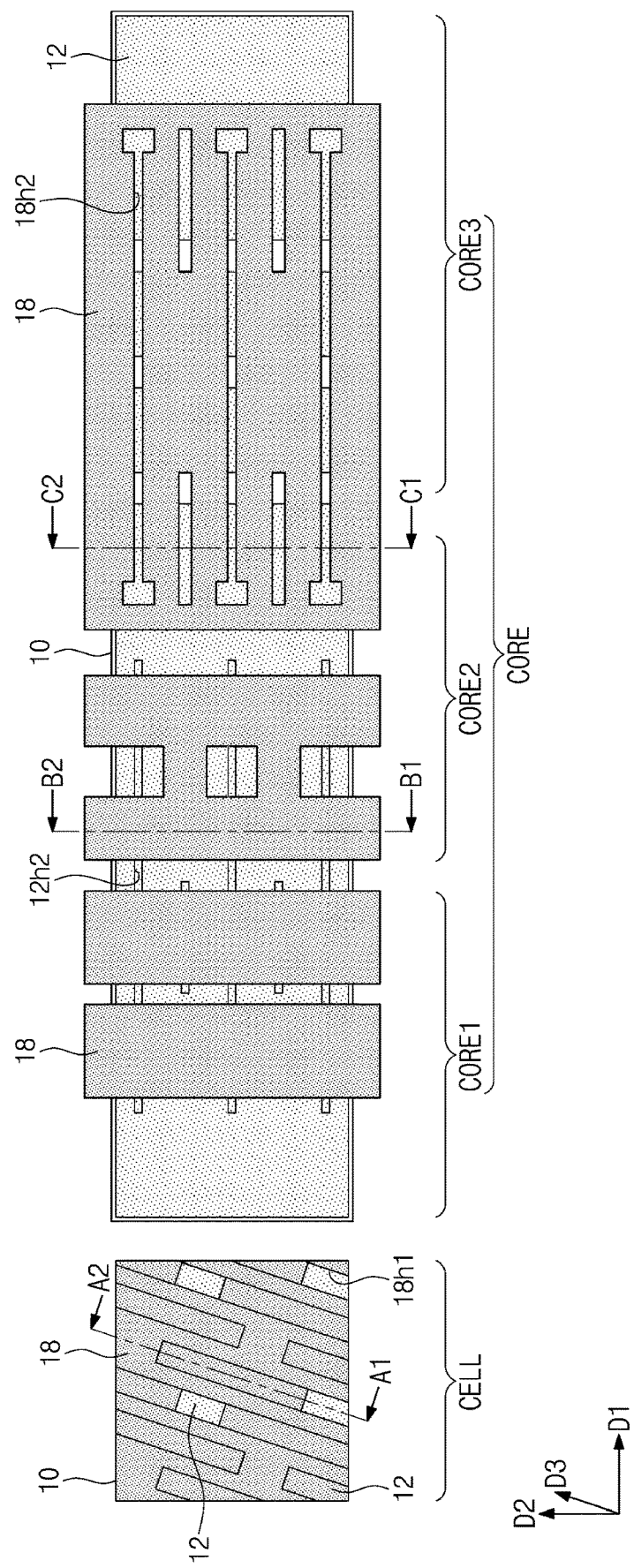

In other embodiments, the formation of the second mask 16 and the second photoresist pattern 18 on the substrate 10 on which the patterned first mask 12 is formed (as discussed and shown in FIGS. 6A and 6B) may be replaced with the formation of the second photoresist pattern 18 on the substrate 10 on which the patterned first mask 12 is formed, as shown in FIGS. 8A and 8B. On the cell region CELL, the second photoresist pattern 18 may have a continuous shape including a plurality of first openings 18h1 that expose portions of the patterned first mask 12. On the core region CORE, the second photoresist pattern 18 may have a discrete shape including a plurality of second openings 18h2 that expose portions of the first mask 12. Other descriptions of the second photoresist pattern 18 may be identical or similar to those discussed in FIGS. 6A and 6B.

Figure 9A:
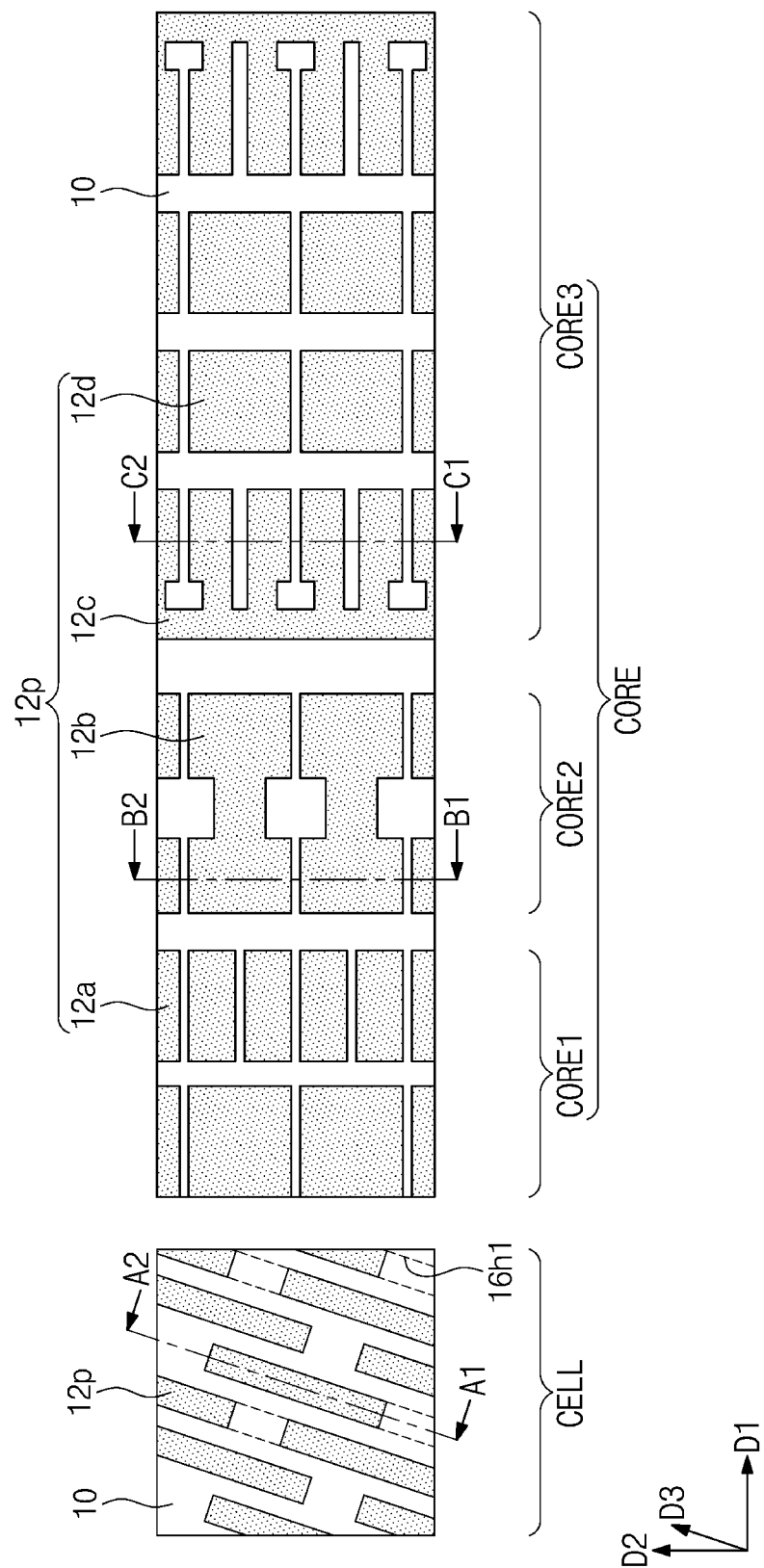
Figure 9B:
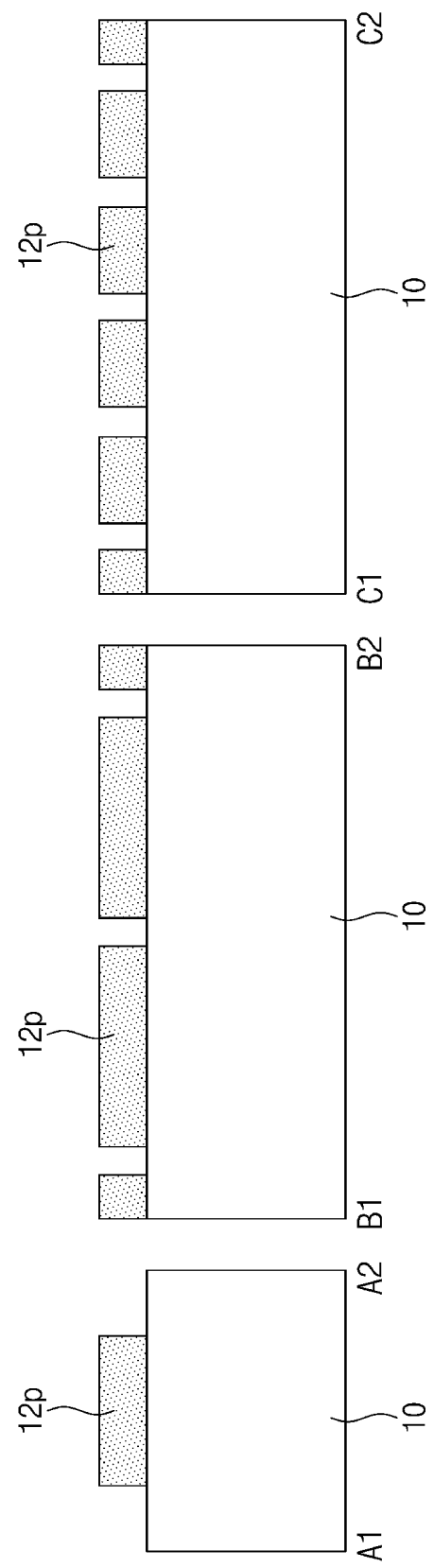

Referring to FIGS. 9A and 9B, the patterned first mask 12 may be patterned by an etching process in which the patterned second mask 16 shown in FIGS. 7A and 7B is used as an etching mask, and then the patterned second mask 16 may be removed. Alternatively, the patterned first mask 12 may be patterned by an etching process in which the second photoresist pattern 18 shown in FIGS. 8A and 8B is used as an etching mask. As discussed above, the first mask 12 may be patterned twice, such that a mask pattern 12p may be formed on the substrate 10.

On the cell region CELL, the mask pattern 12p may have an island shape, e.g., with respective mask patterns 12p spaced apart from one another in one or more directions. For example, portions of the patterned first mask 12 which are exposed to or by the first opening 16h1 of the patterned second mask 16 (as discussed and shown in FIGS. 7A and 7B) may be removed. On the cell region CELL, the first mask 12 may have a discontinuous shape as shown in FIGS. 5A and 5B because the first mask 12 is removed at portions exposed to the first opening 14h1 of the first photoresist pattern 14 discussed in FIGS. 4A and 4B. In addition, the patterned first mask 12 may be removed at portions exposed to the first opening 16h1 of the patterned second mask 16 discussed in FIGS. 7A and 7B. Therefore, on the cell region CELL, the first mask 12 may be changed into the island-shaped mask pattern 12p.

On the core region CORE, the mask pattern 12p may have various shapes. For example, as discussed above with reference to FIG. 1D, the mask pattern 12p may include at least one sub-pattern 12a having a rectangular shape or a similar shape thereto, at least one sub-pattern 12b having a dumbbell shape or a similar shape thereto, at least one sub-pattern 12c having a comb shape or a similar shape thereto, and at least one sub-pattern 12d having a square shape or a similar shape thereto.

As discussed above with reference to FIG. 1E, because the mask pattern 12p is constituted by the overlapping section 15 where the first and second masks 12 and 16 overlap each other, no rounded corner may be included in the mask pattern 12p on the core region CORE. That is, the mask pattern 12p may be free of rounded corners. For example, the sub-patterns 12a, 12b, 12c, and 12d of the mask pattern 12p may each include sharp corners, e.g., right-angled or near-right-angled corners.

Figure 10A:
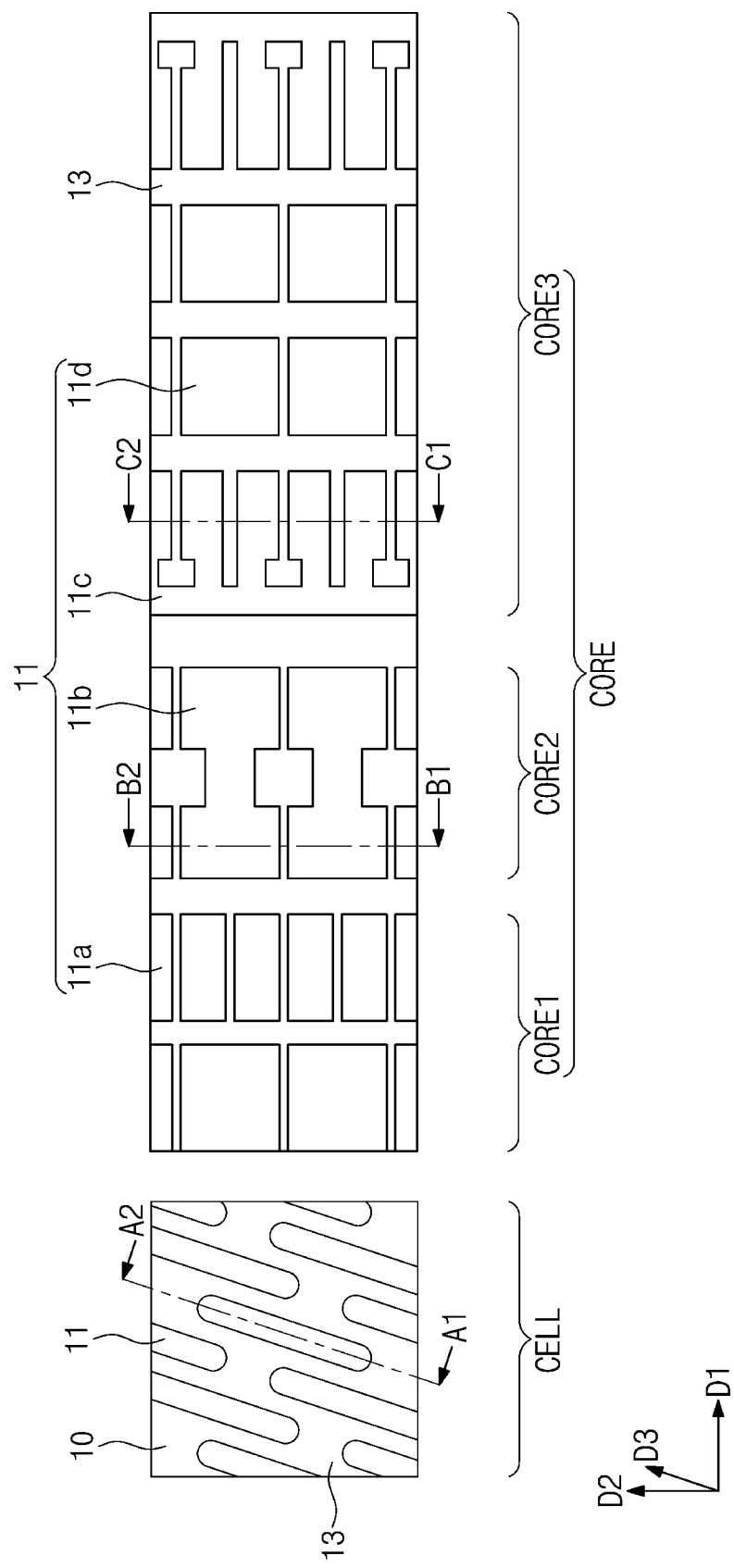
Figure 10B:
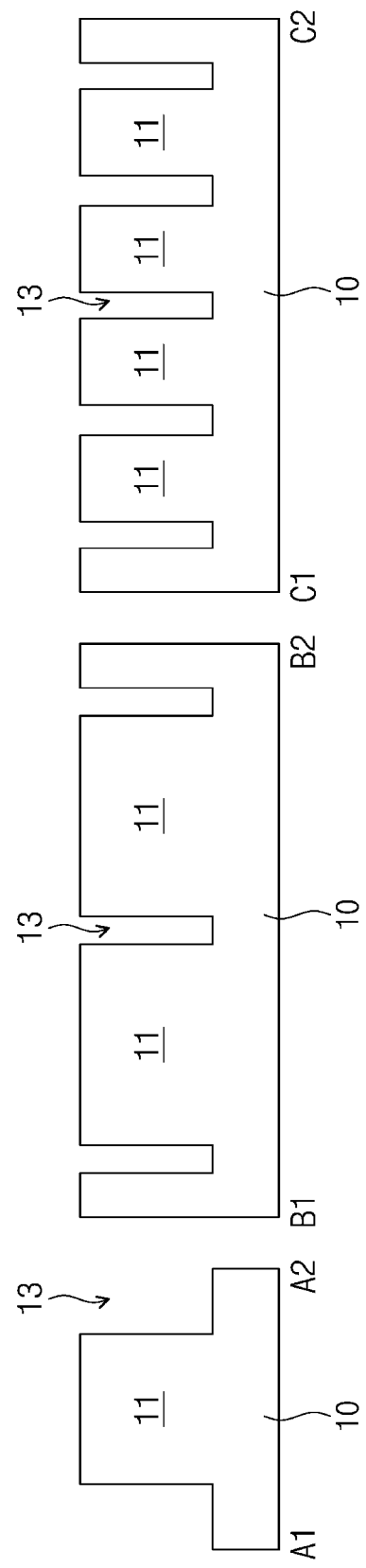

Referring to FIGS. 10A and 10B, the substrate 10 may be patterned by an etching process in which the mask pattern 12p is used as an etching mask, such that trenches 13 may be formed which define active patterns 11. On the cell region CELL, the active pattern 11 may be shaped like islands that extend along the third direction D3 and are arranged regularly, e.g., at regular intervals. Alternatively, on the cell region CELL, the active patterns 11 may have shapes that discontinuously or continuously extend along one of the first, second, and third directions D1, D2, and D3.

On the core region CORE, as discussed above with reference to FIG. 1G, the active pattern 11 may include at least one active pattern 11a having a rectangular shape or a similar shape thereto, at least one active pattern 11b having a dumbbell shape or a similar shape thereto, at least one active pattern 11c having a comb shape or a similar shape thereto, and at least one active pattern 11d having a square shape or a similar shape thereto. The active patterns 11a, 11b, 11c, and 11d may be arranged spaced apart from each other in the first direction D1 and/or the second direction D2.

One or more of the active patterns 11a, 11b, 11c, and 11d may be included in one or more of the first, second, and third regions CORE1, CORE2, and CORE3 of the core region CORE. Alternatively, two or more of the active patterns 11a, 11b, 11c, and 11d may be included in one or more of the first, second, and third regions CORE1, CORE2, and CORE3 of the core region CORE, and the two or more active patterns may have the same or different shapes.

For example, the rectangular-shaped active pattern 11a and/or the square-shaped active pattern 11d may be mainly formed on the first region CORE1 of the core region CORE. The dumbbell-shaped active pattern 11b may be mainly formed on the second region CORE2 of the core region CORE. The comb-shaped active pattern 11c and/or the square-shaped active pattern 11d may be mainly formed on the third region CORE3 of the core region CORE. The present inventive concepts, however, are not limited thereto.

Figure 11A:
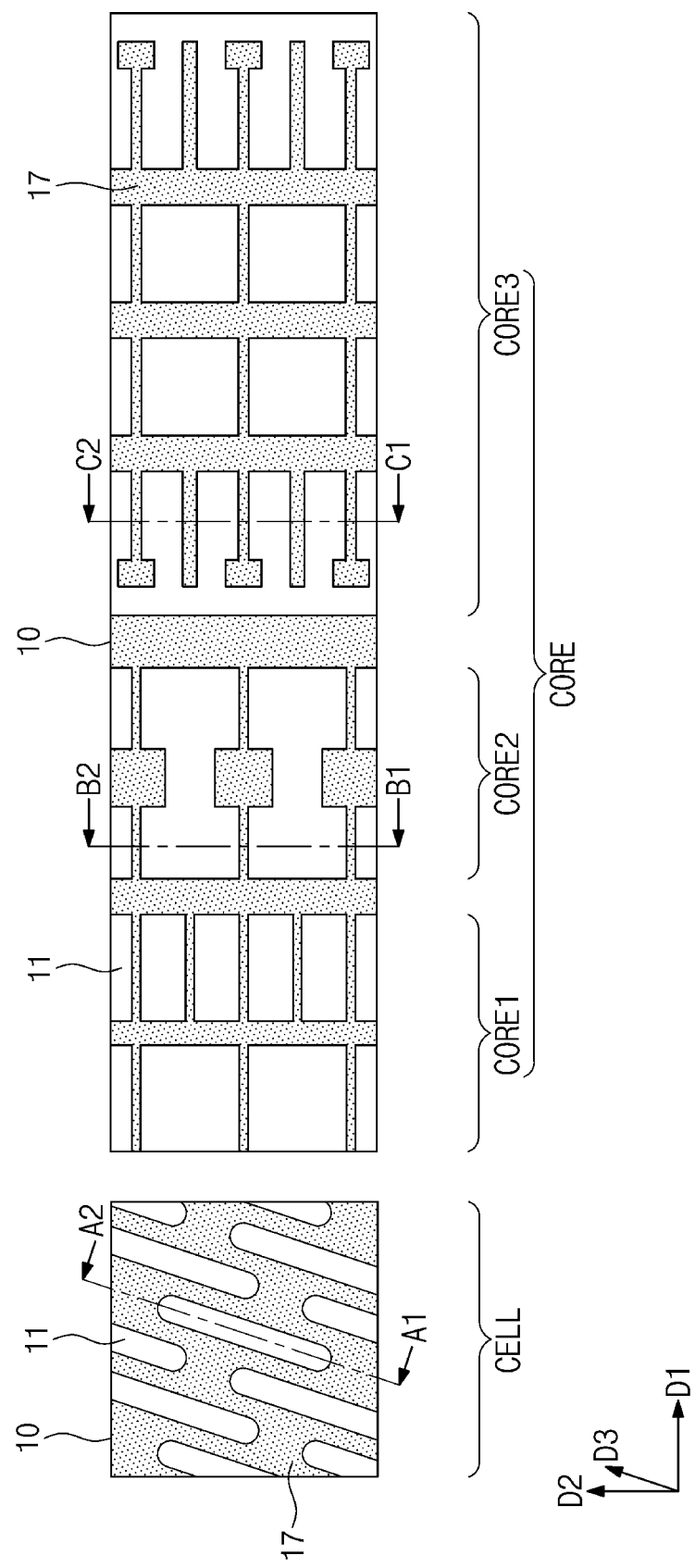
Figure 11B:
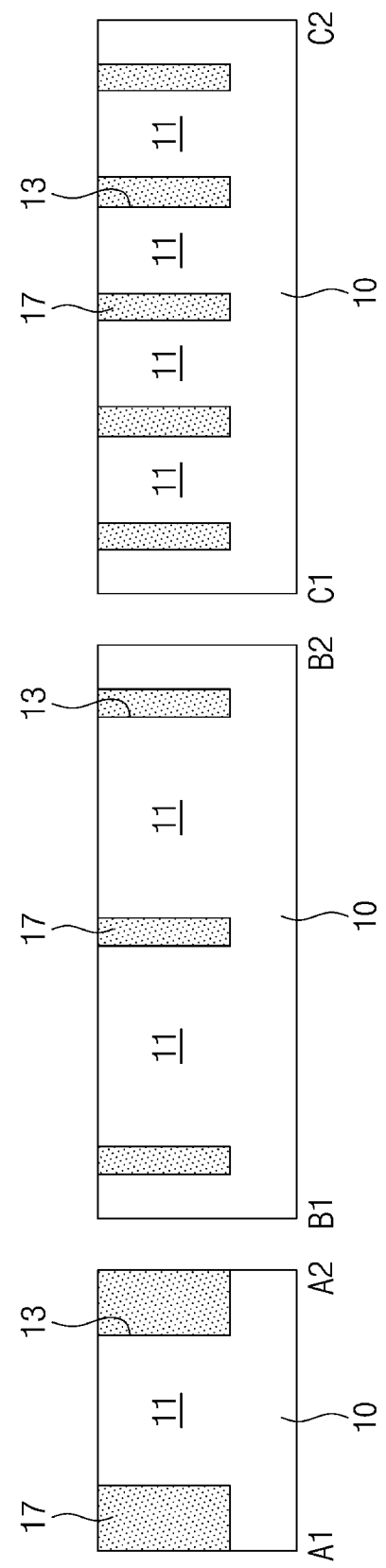

Referring to FIGS. 11A and 11B, the trenches 13 may be filled with a dielectric material to form a device isolation layer 17. Word lines may be formed to run across the active patterns 11, bit lines may be formed to intersect the word lines, various conductive patterns may be formed to have electrical connection with the word lines and the bit lines, and different kinds of dielectric layers may be formed, with the result that a semiconductor device may be achieved on the substrate 10. The semiconductor device achieved on the substrate 10 is not limited to any particular type thereof. For example, the semiconductor device may include a memory device, a logic device, or a combination thereof. This will be further discussed below with reference to FIGS. 13A and 13B.

In addition to the formation of sharp corners (e.g., having a RI of about 15 nm or less) on the mask pattern 12p or the active pattern 11 when the overlapping section 15 between the first mask 12 and the second mask 16 is used as discussed above with reference to FIG. 1E, a decrease in critical dimension (CD) may be accomplished in forming the mask pattern 12p or the active pattern 11. This will be further discussed below with reference to FIGS. 12A to 12E.

FIGS. 12A to 12D illustrate cross-sectional views showing substrate patterning methods according to some example embodiments of the present inventive concepts. FIG. 12E illustrates a plan view showing substrate patterning methods according to some example embodiments of the present inventive concepts.

Figure 12A:
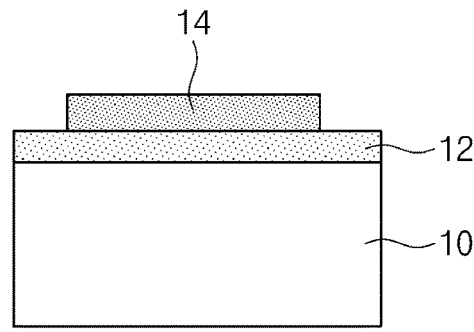
FIGS. 12A, 12B, 12C, and 12D illustrate cross-sectional views showing substrate patterning methods according to some example embodiments of the present inventive concepts.

Referring to FIG. 12A, the first mask 12 may be formed on the substrate 10, and the first photoresist pattern 14 may be formed on the first mask 12. The substrate 10 may be an etching target layer, or an etching target layer may be formed on the substrate 10. The first mask 12 may be patterned by an etching process in which the first photoresist pattern 14 is used as an etching mask.

Figure 12B:
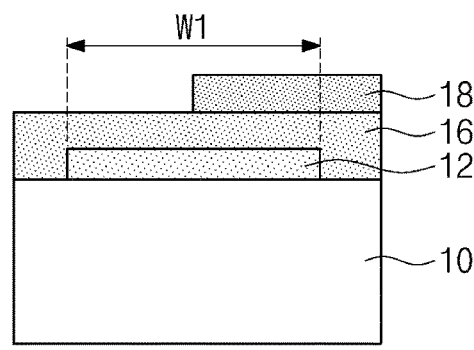

Referring to FIG. 12B, the etching process may form the patterned first mask 12 on the substrate 10. The patterned first mask 12 may have a first width W1. On the substrate 10, the second mask 16 may be formed to cover the patterned first mask 12, and the second photoresist pattern 18 may be formed on the second mask 16. The second photoresist pattern 18 may have a shape that covers a portion of the patterned first mask 12.

Figure 12C:
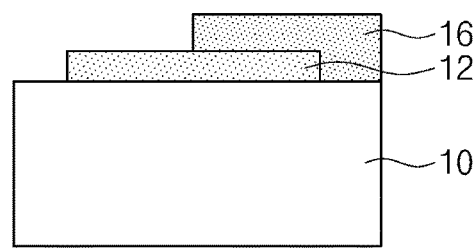

Referring to FIG. 12C, the second mask 16 may be patterned by an etching process in which the second photoresist pattern 18 is used as an etching mask. The patterned second mask 16 may cover a portion of the patterned first mask 12 and expose other portion of the patterned first mask 12. The patterned first mask 12 may be patterned by an etching process in which the patterned second mask 16 is used as an etching mask.

Figure 12D:
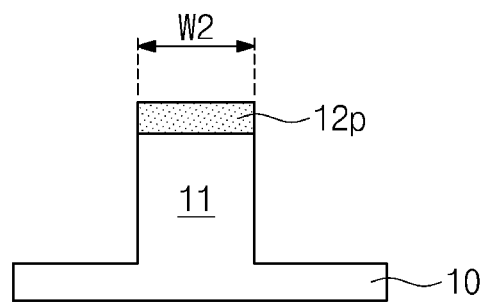
Figure 12E:
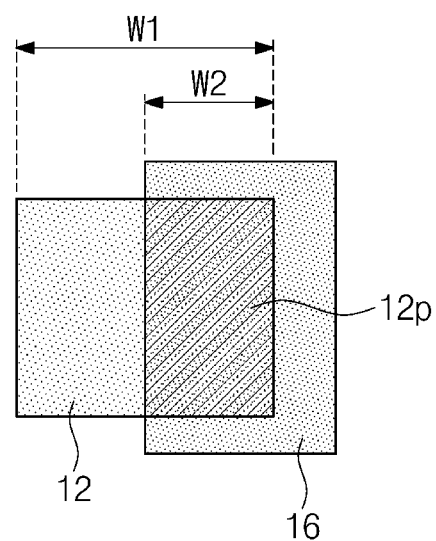
FIG. 12E illustrates a plan view showing substrate patterning methods according to some example embodiments of the present inventive concepts.

Referring to FIG. 12D, the mask pattern 12p may be formed from the first mask 12 that is patterned twice by the etching processes. The mask pattern 12p may have a second width W2 less than the first width W1 of the patterned first mask 12. For example, the mask pattern 12p may have a second width W2 that overcomes the limit of minimum value or dimension.

For example, referring to FIG. 12E, even though the first width W1 is a minimum value capable of being achieved on the first mask 12, a section where the first and second masks 12 and 16 overlap or intersect may be formed into the mask pattern 12p. Therefore, the mask pattern 12p may have the second width W2 that is beyond a minimum value capable of being formed by patterning.

Referring back to FIG. 12D, the substrate 10 may be patterned by an etching process in which the mask pattern 12p is used as an etching mask. The patterning may form the active pattern 11 having the second width W2 on the substrate 10. The patterning method discussed with reference to FIGS. 12A to 12E may be identically or similarly applicable to the formation of any other patterns in addition to the active pattern 11.

Figure 13A:
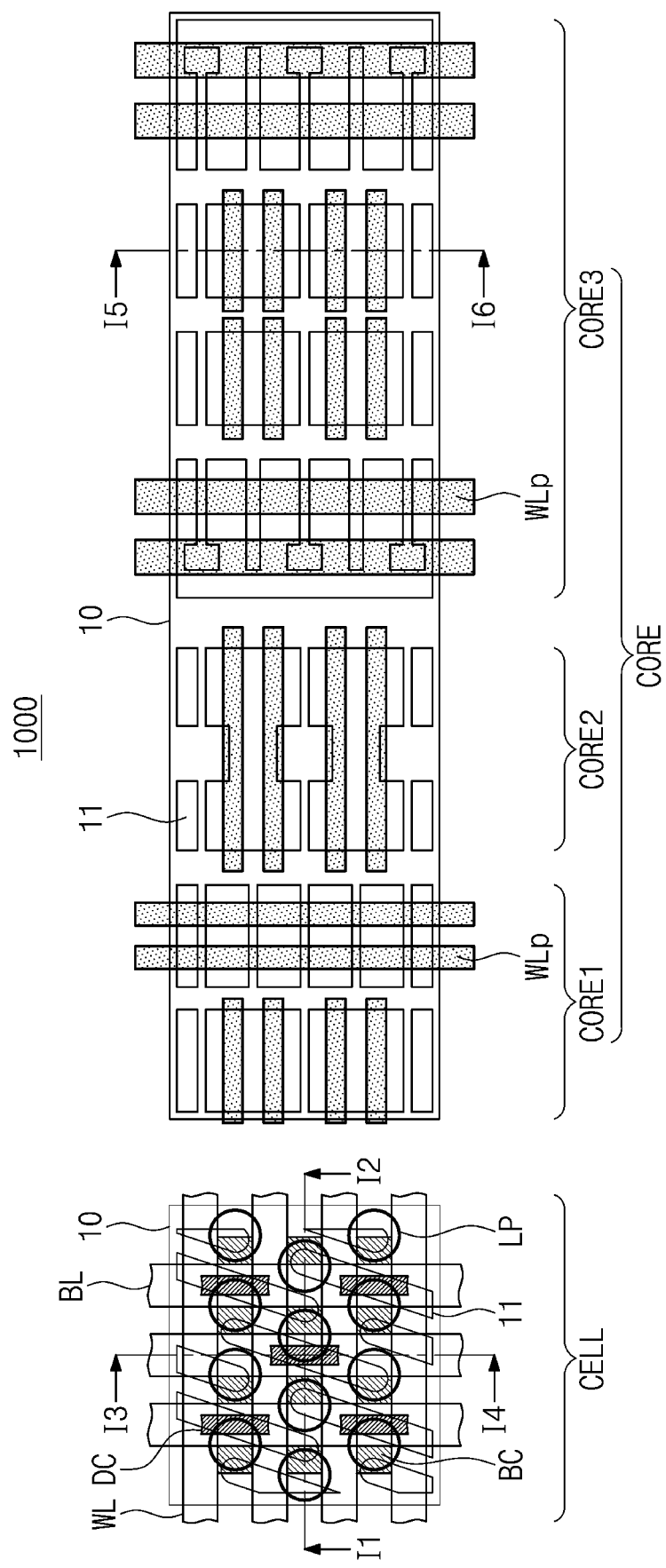
FIG. 13A illustrates a cross-sectional view showing a semiconductor device that includes an active pattern according to some example embodiments of the present inventive concepts.
Figure 13B:
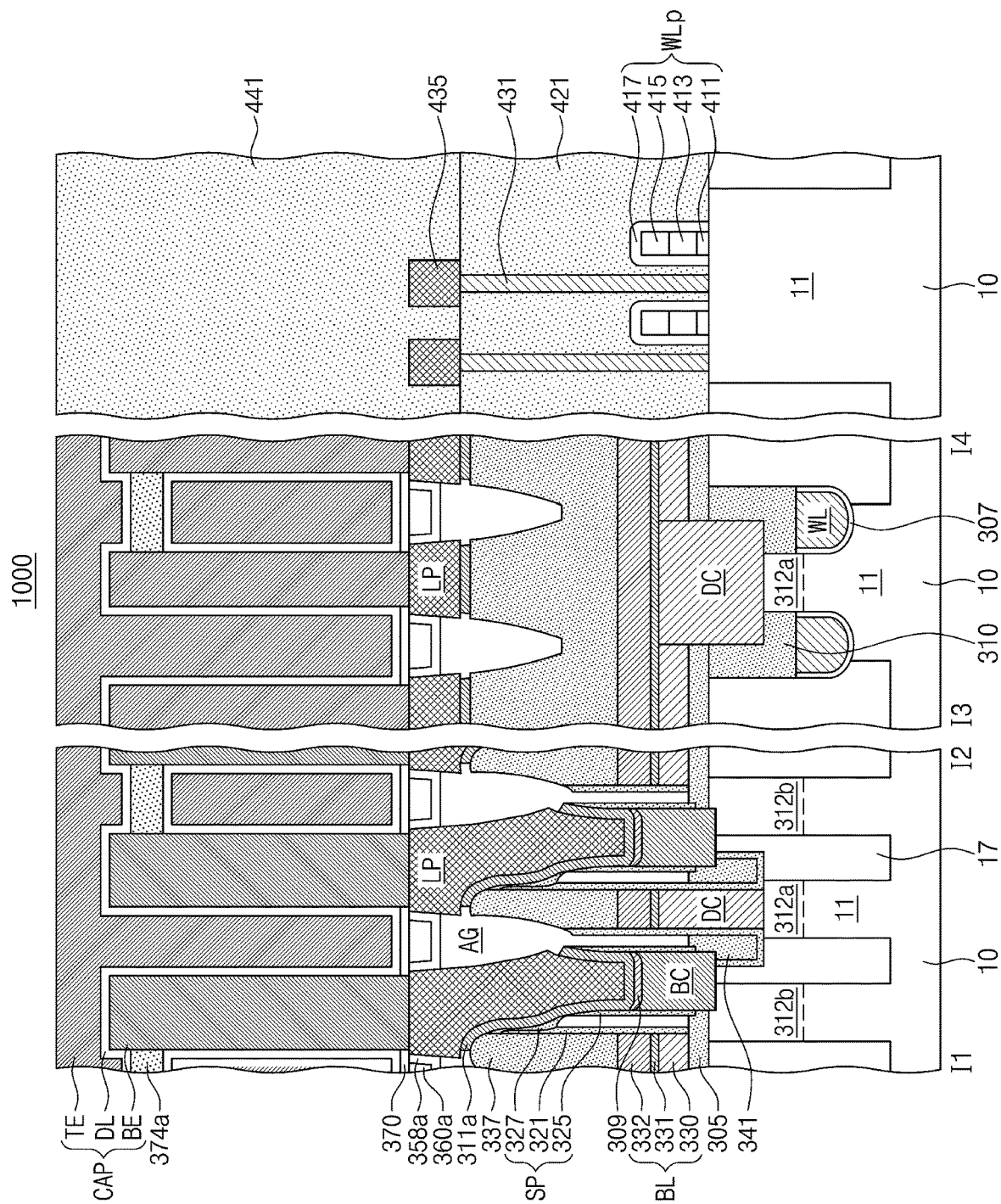
FIG. 13B illustrates a cross-sectional view taken along lines I1-I2, I3-I4, and I5-I6 of FIG. 13A, showing a semiconductor device that includes an active pattern according to some example embodiments of the present inventive concepts.

FIG. 13A illustrates a cross-sectional view showing a semiconductor device that includes active patterns according to some example embodiments of the present inventive concepts. FIG. 13B illustrates a cross-sectional view taken along lines I1-I2, I3-I4, and I5-I6 of FIG. 13A, showing a semiconductor device that includes an active pattern according to some example embodiments of the present inventive concepts.

Referring to FIGS. 13A and 13B, a semiconductor device 1000 may be provided. The semiconductor device 1000 may be a memory device, such as dynamic random access memory (DRAM). Word lines WL may be provided on the cell region CELL of the substrate 10 having the active patterns 11 defined by the device isolation layer 17, and peripheral word lines WLp may be formed on the core region CORE of the substrate 10. The word lines WL may be arranged spaced apart from each other in the second direction D2 and may extend along the first direction D1. The word lines WL may have respective shapes that are embedded in the substrate 10. Gate dielectric layers 307 may be provided below the word lines WL.

A first doped region 312a may be disposed in the active pattern 11 between a pair of word lines WL, and a pair of second doped regions 312b may be disposed on opposite edges of the active pattern 11. The first and second doped regions 312a and 112b may be doped with, for example, N-type impurities. The first doped region 312a may correspond to a common drain region, and the second doped regions 112b may correspond to source regions. A transistor may be defined by one of the word lines WL and its adjacent first and second doped regions 312a and 312b.

Word line capping patterns 310 may be disposed on corresponding word lines WL. The word line capping pattern 310 may have a linear shape that extends along a longitudinal direction of the word line WL. An interlayer dielectric layer 305 may be disposed on the substrate 10. The interlayer dielectric layer 305 may be formed to have island shapes that are spaced apart from each other in plan view.

Bit lines BL may be disposed on the interlayer dielectric layer 305. The bit lines BL may run across the word line capping patterns 310 and the word lines WL. The bit lines BL may be arranged spaced apart from each other along the first direction D1 and may extend along the second direction D2. Each of the bit lines BL may include a bit line polysilicon pattern 330, a bit line ohmic pattern 331, and a bit line metal-containing pattern 332 that are sequentially stacked. Bit line capping patterns 337 may be disposed on corresponding bit lines BL. The bit line capping patterns 337 may be formed of a dielectric material, such as a silicon nitride layer.

Bit line contacts DC may be provided which are partially embedded in the substrate 10 between adjacent word lines WL. The bit line contact DC may electrically connect the first doped region 312a to the bit line BL. A lower buried dielectric layer 341 may be disposed on a lateral surface of the bit line contact DC.

Storage node contacts BC may be disposed between a pair of adjacent bit lines BL. The storage node contacts BC may be spaced apart from each other. The storage node contacts DC may include impurity-doped polysilicon or impurity-undoped polysilicon. A bit line spacer SP may be interposed between the bit line BL and the storage node contact BC. The bit line spacer SP may include a first sub-spacer 321 and a second sub-spacer 325 that are spaced apart from each other across an air gap AG. The first sub-spacer 321 may cover a sidewall of the bit line BL and a sidewall of the bit line capping pattern 337. The second sub-spacer 325 may be adjacent to the storage node contact BC. The first sub-spacer 321 and the second sub-spacer 325 may include the same material, for example, a silicon nitride layer.

A storage node ohmic layer 309 may be disposed on the storage node contact BC. The storage node ohmic layer 309 may include metal silicide. A diffusion break pattern 311a may conformally cover the storage node ohmic layer 309, the first and second sub-spacers 321 and 325, and the bit line capping pattern 337. The diffusion break pattern 311a may include metal nitride, such as a titanium nitride layer or a tantalum nitride layer. A landing pad LP may be disposed on the diffusion break pattern 311a.

The landing pad LP may be formed of a material containing metal such as tungsten. The landing pad LP may have an upper portion whose width is greater than that of the storage node contact BC. The landing pad LP may have a center that is shifted from that of the storage node contact BC. A first capping pattern 358a and a second capping pattern 360a may be provided between neighboring landing pads LP. The first and second capping patterns 358a and 360a may independently include a silicon nitride layer, a silicon oxide layer, a silicon oxynitride layer, or a porous layer. The first capping pattern 358a may have porosity greater than that of the second capping pattern 360a.

The air gap AG between the first and second sub-spacers 321 and 325 may extend a space between the landing pads LP. The air gap AG may partially expose the first capping pattern 358a, the bit line capping pattern 337, and the landing pad LP.

Bottom electrodes BE may be disposed on corresponding landing pads LP. The bottom electrode BE may include an impurity-doped polysilicon layer, a metal nitride layer such as a titanium nitride layer, and/or a metal layer such as tungsten, aluminum, or copper. The bottom electrode BE may have a circular columnar shape, a hollow cylindrical shape, or a cup shape. A support pattern 374a may connect upper sidewalls of neighboring bottom electrodes BE. The support pattern 374a may include dielectric material, such as a silicon nitride layer, a silicon oxide layer, or a silicon oxynitride layer.

Between the bottom electrodes BE, an etching stop layer 370 may cover the first and second capping patterns 358a and 360a. The etching stop layer 370 may include a dielectric material, such as a silicon nitride layer, a silicon oxide layer, or a silicon oxynitride layer. A dielectric layer DL may cover surfaces of the bottom electrodes BE and a surface of the support pattern 374a. The dielectric layer DL may be covered with a top electrode TE. The top electrode TE may include an impurity-doped polysilicon layer, an impurity-doped silicon-germanium layer, a metal nitride layer such as a titanium nitride layer, and/or a metal layer such as tungsten, aluminum, or copper. The bottom electrode BE, the dielectric layer DL, and the top electrode TE may constitute a capacitor CAP.

On the core region CORE of the substrate 100, the peripheral word line WLp may include a gate dielectric layer 411, a first electrode 413, a second electrode 415, and a spacer 417 that surrounds the first and second electrodes 413 and 415. For example, the first electrode 413 may include polysilicon, and the second electrode 415 may include tungsten. An interlayer dielectric layer 421 may cover the substrate 10 of the core region CORE. Contac plugs 431 may be provided which penetrate the interlayer dielectric layer 421 and have electrical connection with the substrate 10, and connection lines 435 may be provided which are electrically coupled to the contact plugs 431 and provided on the interlayer dielectric layer 421.

An additional interlayer dielectric layer 441 may further be provided on the interlayer dielectric layer 421. Although not shown, additional contact plugs may further be provided which penetrate the additional interlayer dielectric layer 441, and additional connection lines may further be provided which are disposed on the additional interlayer dielectric layer 441 and electrically coupled to the additional contact plugs.

In some embodiments, the active patterns 11 on the core region CORE may have no or reduced corner rounding or may have sharp corners. Therefore, some problems associated with the active patterns 11, such as an increase in size and a contact between adjacent corners that may be caused by corner rounding, can be reduced and/or avoided. In conclusion, the active patterns 11 may increase device integration, and the semiconductor device 1000 may have improved electrical characteristics.

According to the present inventive concepts, because a section where masks intersect each other is formed into a mask pattern, it may be possible to achieve an active pattern having sharp corners. As such, the active pattern may be reduced or prevented from corner rounding, and thus an increase in area and/or contact between corners, which may be caused by the corner rounding, may be reduced or prevented.

Accordingly, the active patterns may decrease in size without electric shorting therebetween. Consequently, a semiconductor device may increase in integration and improve in electrical characteristics.

This detailed description of the present inventive concepts should not be construed as limited to the embodiments set forth herein, and it is intended that the present inventive concepts cover the various combinations, the modifications and variations of this invention without departing from the spirit and scope of the present inventive concepts. The appended claims should be construed to include other embodiments.

What is claimed is:

1. A semiconductor device, comprising:
   a substrate comprising an active pattern;
   a cell region on the substrate, the cell region comprising a cell circuit; and
   a core region on the substrate, the core region comprising a peripheral circuit,
   wherein, in plan view, the active pattern on the core region comprises a plurality of corners,
   wherein each of the corners has a rounding index that is equal to or less than about 15 nm, wherein the rounding index indicates a distance between a respective tip of the each of the corners and a right-angled corner.

2. The semiconductor device of claim 1, wherein the rounding index of the each of the corners is in a range of about 5 nm to about 15 nm.

3. The semiconductor device of claim 1, wherein the rounding index of the each of the corners is zero.

4. The semiconductor device of claim 1, wherein the core region comprises:
   a first core region on at least one side of the cell region; and
   a second core region on at least one other side of the cell region,
   wherein the active pattern is on at least one of the first and second core regions.

5. The semiconductor device of claim 4, wherein one of the first and second core regions comprises a sense amplifier circuit, and another of the first and second core regions comprises a sub-word line driver circuit.

6. The semiconductor device of claim 1, wherein the each of the corners has a corner angle of about 90°.

7. The semiconductor device of claim 1, wherein the peripheral circuit is a first peripheral circuit, and further comprising a peripheral region on the substrate, the peripheral region comprising a second peripheral circuit,
   wherein the active pattern comprises first and second active patterns, wherein a density of the first active patterns on the core region is greater than a density of the second active patterns on the peripheral region.

8. The semiconductor device of claim 1, wherein the peripheral circuit comprises first and second peripheral circuits, and wherein the core region comprises:
a plurality of first core regions comprising the first peripheral circuits on opposite sides of the cell region; and
a plurality of second core regions comprising the second peripheral circuits on other opposite sides of the cell region,
wherein at least one of the first and second core regions comprises:
the active pattern comprising the plurality of corners, wherein the rounding index is zero; or
the active pattern comprising the plurality of corners, wherein the rounding index is equal to or less than about 15 nm.

9. The semiconductor device of claim 8, wherein
the cell circuit comprises a memory circuit,
the first peripheral circuits comprise a sense amplifier circuit, and
the second peripheral circuits comprise a sub-word line driver circuit.

10. A semiconductor device, comprising:
a substrate comprising a cell region and a core region; and
active patterns on the cell region and on the core region, wherein
the core region is divided into a plurality of regions,
wherein, in plan view, ones of the active patterns on each of the plurality of regions respectively comprise a plurality of corners, and
each of the corners has a rounding index that is equal to or less than about 15 nm, wherein the rounding index indicates a distance between a respective tip of the each of the corners and a right-angled corner.

11. The semiconductor device of claim 10, wherein the active patterns on the core region comprise:
a first active pattern that has a tetragonal shape;
a second active pattern that has a dumbbell shape; and
a third active pattern that has a comb shape.

12. The semiconductor device of claim 11, wherein one or more of the first, second, or third active patterns are provided in plural.

13. The semiconductor device of claim 11, wherein each of the plurality of regions comprises one or more of the first, second, or third active patterns.

14. The semiconductor device of claim 11, wherein at least one of the plurality of regions comprises two or more of the first, second, or third active patterns,
wherein the two or more of the first, second, or third active patterns have a same shape or different shapes from each other.

15. The semiconductor device of claim 11, wherein neighboring ones of the first, second, or third active patterns are spaced apart from each other in a first direction and are spaced apart from each other in a second direction intersecting the first direction.

16. The semiconductor device of claim 11, wherein the active patterns on the cell region comprise a plurality of cell active patterns,
wherein each of the cell active patterns extends discontinuously or continuously in at least one of the first direction, the second direction, or a third direction intersecting the first and second directions.

17. The semiconductor device of claim 16, wherein each of the cell active patterns has an island shape that extends along the third direction intersecting the first and second directions.

18. A semiconductor device, comprising:
a semiconductor substrate comprising a cell region on which a memory circuit is provided and a core region on which a peripheral circuit is provided;
a plurality of cell active patterns on the cell region, the cell active patterns having a same shape and arranged spaced apart from one another; and
a plurality of peripheral active patterns on the core region,
wherein, in plan view, each of the peripheral active patterns has a plurality of corners,
wherein each of the corners has a rounding index that is equal to or less than about 15 nm, wherein the rounding index indicates a distance between a respective tip of the each of the corners and a right-angled corner.

19. The semiconductor device of claim 18, wherein
the same shape of the cell active patterns comprises an island shape, and
the peripheral active patterns have respective shapes that are different from the island shape.

20. The semiconductor device of claim 18, wherein the peripheral active patterns comprise:
a plurality of first peripheral active patterns, each of which has a tetragonal shape;
a plurality of second peripheral active patterns, each of which has a dumbbell shape; and
a plurality of third peripheral active patterns, each of which has a comb shape,
wherein the first, second, and third peripheral active patterns are arranged along a first direction or a second direction perpendicular to the first direction, and
wherein each of the cell active patterns has an island shape that extends along a third direction intersecting the first and second directions.

* * * * *